US012532517B2

(12) United States Patent
Ching et al.

(10) Patent No.: US 12,532,517 B2
(45) Date of Patent: Jan. 20, 2026

(54) FILL FINS FOR SEMICONDUCTOR DEVICES

(71) Applicant: Taiwan Semiconductor Manufacturing Co. Ltd., Hsin-Chu (TW)

(72) Inventors: Kuo-Cheng Ching, Hsinchu County (TW); Chih-Hao Wang, Hsinchu County (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/295,010

(22) Filed: Apr. 3, 2023

(65) Prior Publication Data

US 2023/0246069 A1    Aug. 3, 2023

Related U.S. Application Data

(60) Continuation of application No. 17/135,623, filed on Dec. 28, 2020, now Pat. No. 11,621,323, which is a
(Continued)

(51) Int. Cl.
*H01L 29/06* (2006.01)
*H01L 21/8234* (2006.01)
(Continued)

(52) U.S. Cl.
CPC ......... *H10D 62/116* (2025.01); *H10D 62/151* (2025.01); *H10D 64/017* (2025.01);
(Continued)

(58) Field of Classification Search
CPC .................................................. H01L 29/0649
See application file for complete search history.

(56) References Cited

U.S. PATENT DOCUMENTS

| 8,772,109 B2 | 7/2014 | Colinge |
| 8,785,285 B2 | 7/2014 | Tsai et al. |

(Continued)

FOREIGN PATENT DOCUMENTS

| CN | 102117828 A | 7/2011 |
| CN | 102315224 A1 | 1/2012 |

(Continued)

*Primary Examiner* — John A Bodnar
(74) *Attorney, Agent, or Firm* — HAYNES AND BOONE, LLP

(57) ABSTRACT

An integrated circuit (IC) structure includes a first channel region, a first gate metal engaging the first channel region, a first dielectric material layer disposed under the first gate metal and on an end of the first gate metal, a second channel region, a second gate metal engaging the second channel region, a second dielectric material layer disposed under the second gate metal and on an end of the second gate metal, and a dielectric block disposed between the end of the first gate metal and the end of the second gate metal. A horizontal portion of the first dielectric material layer abuts a horizontal portion of the second dielectric material layer, and the horizontal portion of the first dielectric material layer and the horizontal portion of the second dielectric material layer are in physical contact with the dielectric block.

20 Claims, 29 Drawing Sheets

Related U.S. Application Data continuation of application No. 16/443,336, filed on Jun. 17, 2019, now Pat. No. 10,879,351, which is a division of application No. 15/689,466, filed on Aug. 29, 2017, now Pat. No. 10,403,714.

(51) Int. Cl.

| | | |
|---|---|---|
| *H01L 21/8238* | (2006.01) | |
| *H01L 27/088* | (2006.01) | |
| *H01L 29/08* | (2006.01) | |
| *H01L 29/49* | (2006.01) | |
| *H01L 29/66* | (2006.01) | |
| *H10D 62/10* | (2025.01) | |
| *H10D 62/13* | (2025.01) | |
| *H10D 64/01* | (2025.01) | |
| *H10D 64/66* | (2025.01) | |
| *H10D 84/01* | (2025.01) | |
| *H10D 84/03* | (2025.01) | |
| *H10D 84/83* | (2025.01) | |
| *H10D 64/68* | (2025.01) | |

(52) U.S. Cl.
CPC ....... *H10D 64/667* (2025.01); *H10D 84/0135* (2025.01); *H10D 84/0151* (2025.01); *H10D 84/0158* (2025.01); *H10D 84/0188* (2025.01); *H10D 84/0193* (2025.01); *H10D 84/038* (2025.01); *H10D 84/834* (2025.01); *H10D 64/691* (2025.01); *H10D 84/0186* (2025.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,171,752 B1 | 10/2015 | Wu et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2007/0170522 A1 | 7/2007 | Lee et al. |
| 2009/0134472 A1 | 5/2009 | Inaba |
| 2013/0065326 A1 | 3/2013 | Sudo |
| 2013/0175584 A1 | 7/2013 | Ho et al. |
| 2014/0145247 A1 | 5/2014 | Cheng et al. |
| 2015/0054078 A1 | 2/2015 | Xie et al. |
| 2016/0049468 A1 | 2/2016 | Wu et al. |
| 2016/0190236 A1* | 6/2016 | Xu .................. H01L 21/823807 257/369 |
| 2016/0233094 A1 | 8/2016 | Anderson et al. |
| 2017/0125411 A1 | 5/2017 | Yu et al. |
| 2017/0162570 A1* | 6/2017 | Shih .................... H01L 21/8258 |
| 2018/0096999 A1* | 4/2018 | Zhou ................. H01L 21/76232 |

FOREIGN PATENT DOCUMENTS

| | | |
|---|---|---|
| CN | 103199011 A | 7/2013 |
| CN | 103296086 A | 9/2013 |
| CN | 106469654 A | 3/2017 |
| CN | 106504990 A | 3/2017 |
| CN | 106549060 A | 3/2017 |
| CN | 106711222 A | 5/2017 |
| JP | 2011243802 A | 12/2011 |

\* cited by examiner

FILL FINS FOR SEMICONDUCTOR DEVICES

PRIORITY

This is a continuation of U.S. application Ser. No. 17/135,623, filed Dec. 28, 2020, which is a continuation of U.S. application Ser. No. 16/443,336, filed Jun. 17, 2019, which is a divisional of U.S. application Ser. No. 15/689,466, filed Aug. 29, 2017, now issued U.S. Pat. No. 10,403,714. The entirety of these applications is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. By way of example, the FinFET fabrication process may include a metal gate deposition followed by a subsequent metal gate cut process. In some cases, the metal gate cut process may result in inter-layer dielectric (ILD) layer loss and work function metal damage, leading to degraded device reliability.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
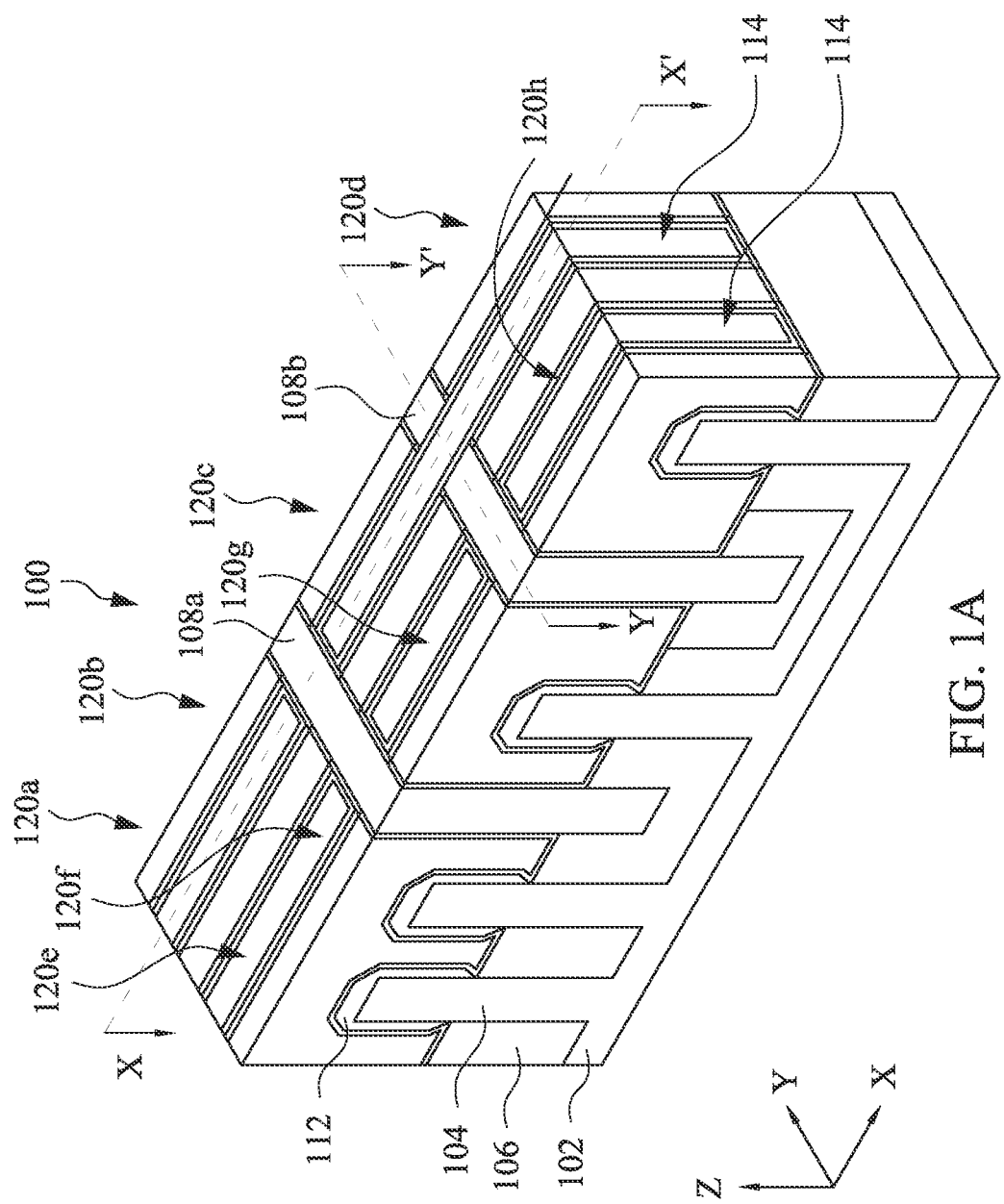
FIG. 1A is a perspective view of a workpiece according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

It is noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (π-gate) devices.

The present disclosure is generally related to semiconductor devices and fabrication. More particularly, some embodiments are related to forming dielectric fill fins along with device fins. By inserting additional fill fins between device fins, the uniformity of fin density is improved and provides better structure fidelity. In some examples, these fill fins (which may also be referred to as dummy fins) are added to regions that lack device fins. The fill fins may be left floating, and in contrast to their functional counterparts, they do not generally contribute to the operation of the circuit. As described below, fill fins may further provide electrical isolation between gate stacks formed on adjacent device fins and/or provide gate interconnect features through openings (e.g., trenches or notches) formed on the fill fins.

Embodiments of the present disclosure offer various advantages, though it is understood that other embodiments may offer different advantages, not all advantages are necessarily discussed herein, and no particular advantage is required for all embodiments. In at least some embodiments, fill fins provide structural support for adjacent device fins, such as increasing fin density and mitigating source/drain (S/D) contact metal pulling into inter-layer dielectric (ILD) layer or into shallow trench isolation (STI) features which may occur if fin density is low. Moreover, in at least some embodiments of the present disclosure, the structure of fill fins substantially avoids ILD layer loss and work function metal damage caused by a metal gate cut process in the metal gate electrode fabrication process. A metal gate electrode fabrication process may include a metal layer deposition followed by a subsequent metal layer cut process. In some cases, the metal layer cut process may result in over etching to the bottom of device fins, leading to ILD layer loss and work function metal damage, causing threshold voltage shifting and device reliability downgrading.

Figure 1B:
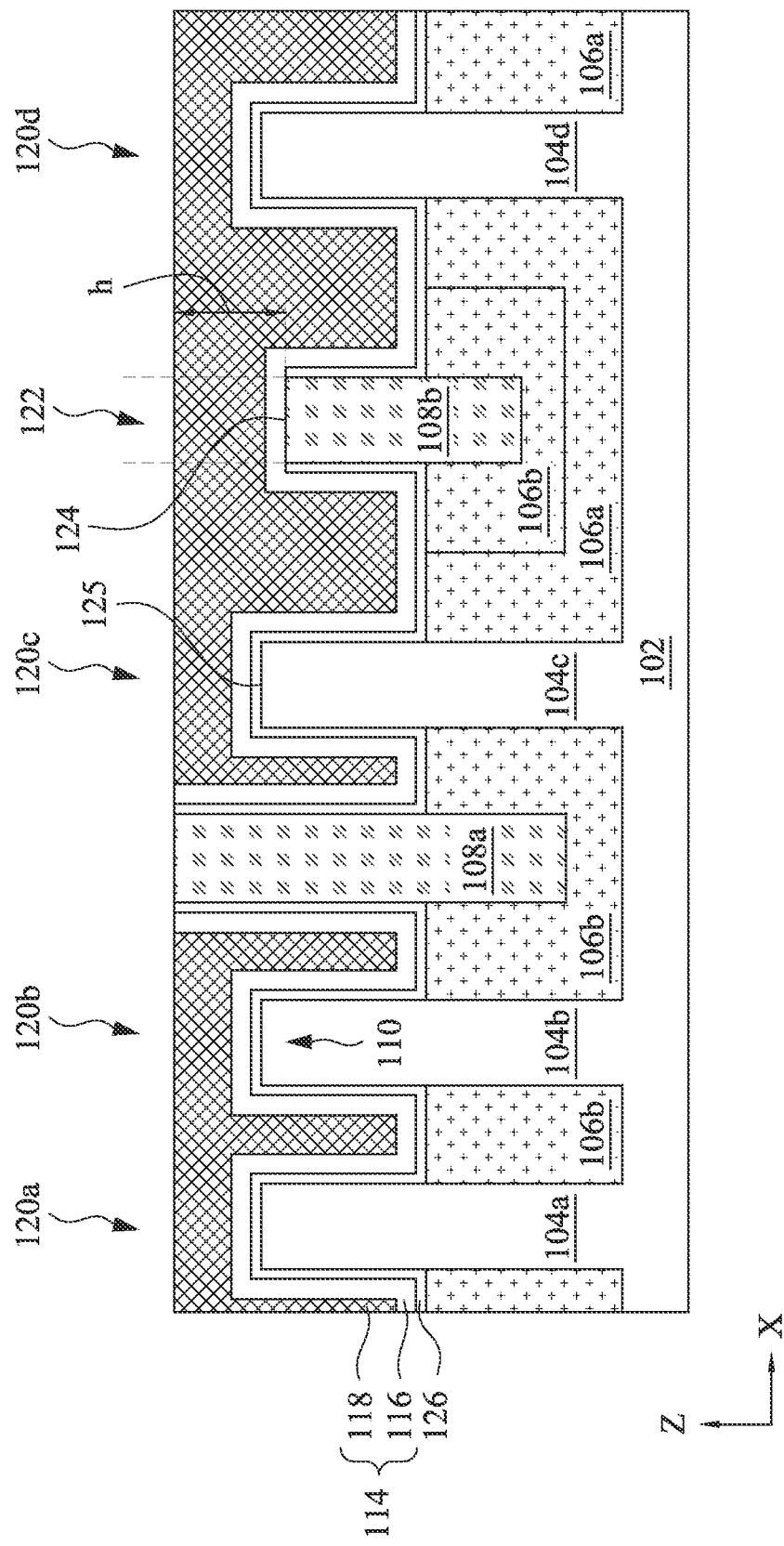
FIGS. 1B and 1C are cross-sectional views of the workpiece in FIG. 1A according to various aspects of the present disclosure.
Figure 1C:
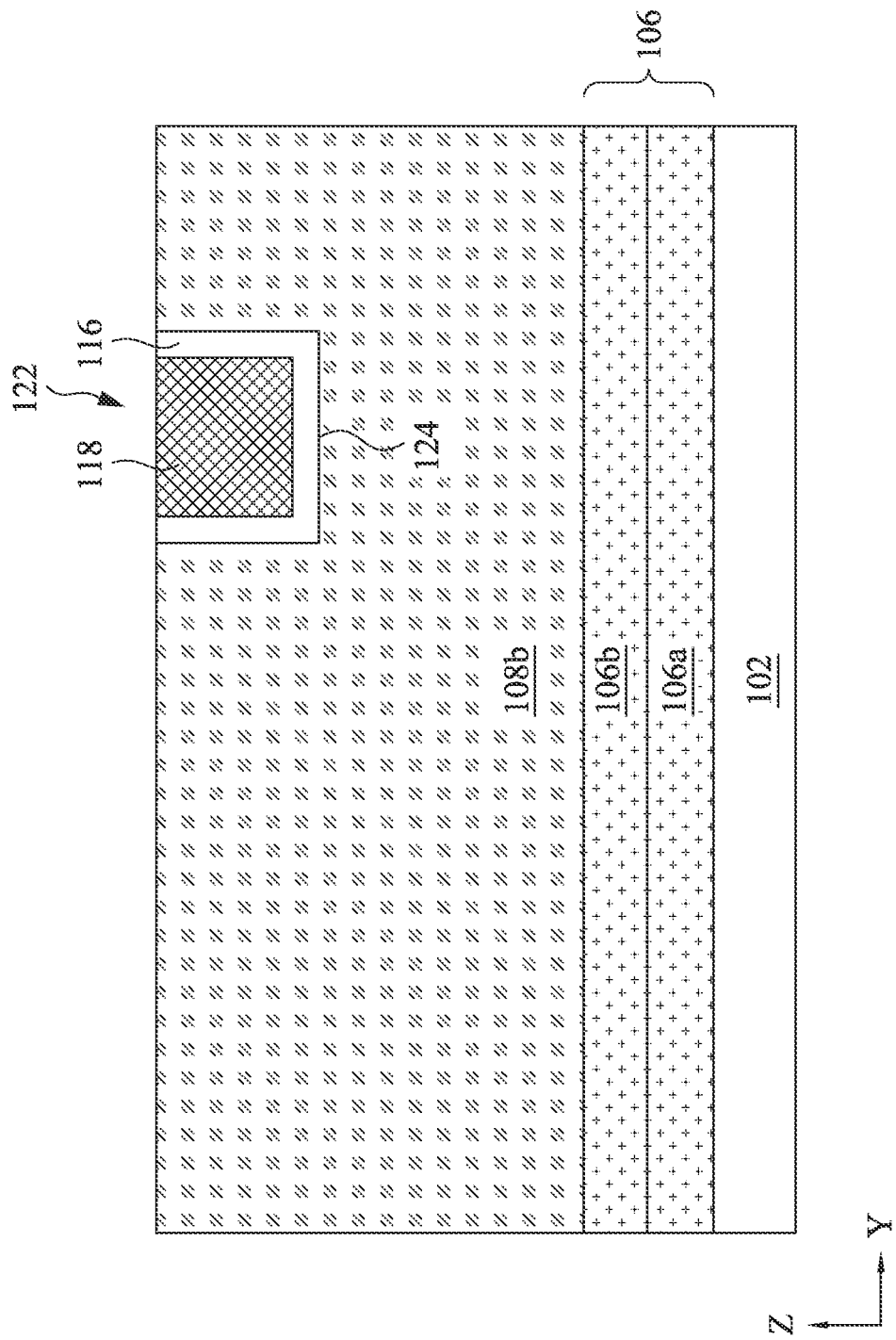

FIG. 1A is a perspective view of a portion of a workpiece 100 according to various aspects of the present disclosure. FIG. 1A has been simplified for the sake of clarity and to better illustrate the concepts of the present disclosure. Additional features may be incorporated into the workpiece 100, and some of the features described below may be replaced or eliminated for other embodiments of the workpiece 100. FIGS. 1B and 1C refer to cross-sections taken through the channel region (e.g., along X-X' line) and fill fin region in lengthwise direction (e.g., along Y-Y' line), respectively. FIGS. 1A, 1B, and 1C are herein described collectively.

The workpiece 100 includes a substrate 102 with one or more device fins 104 (e.g. device fins 104*a*, 104*b*, 104*c*, and 104*d*). formed upon it and separated by isolation features 106. The device fins 104 are also interleaved with the fill fins 108 (e.g., fill fins 108*a* and 108*b*). The device fins 104 are representative of any raised feature, and while the illustrated embodiments include FinFET device fins 104, further embodiments include other raised active and passive devices formed upon the substrate 102. In the illustrated embodiment, the device fins 104 extend from the substrate 102.

The isolation features 106 surround bottom portions of the device fins 104. In some embodiments, the isolation features 106 are shallow trench isolation (STI) features. The isolation features 106 may include one or more sub-layers (e.g., isolation feature layers 106*a* and 106*b*). Each sub-layer may include the same or different dielectric material compositions. In the illustrated embodiment, the isolation feature layer 106*b* surrounds the bottom portion of the fill fin 108*a* and both the isolation feature layers 106*a* and 106*b* surround the bottom portion of the fill fin 108*b*.

In some embodiments, the bottom surface of the fill fin 108*b* is below the top surface of the isolation features 106 in a range of about 30 nm to about 60 nm. In some embodiments, the bottom surface of the fill fin 108*b* is above the bottom surface of the fill fin 108*a*. The device fins 104 and the fill fins 108 may have substantially the same width, such as in a range of about 4 nm to about 8 nm. The distance from one of the device fins 104 to an adjacent fill fin 108 may be in a range of about 8 nm to about 19 nm, such as from about 8 nm to about 16 nm in one example, or from about 12 nm to about 19 nm in another example.

In some embodiments, device fins 104 include a channel region 110 disposed between a pair of opposing source/drain features 112. The flow of carriers (electrons for an n-channel FinFET and holes for a p-channel FinFET) through the channel region 110 is controlled by a voltage applied to a gate stack 114 adjacent to and overwrapping the device fins 104 in the channel region 110. In various embodiments, the gate stack 114 is a multi-layer structure. The gate stack 114 may include a gate dielectric layer 116 and a gate electrode layer 118. In some embodiments, the gate stack 114 further includes an input/output (I/O) oxide layer 126. In some embodiments, the gate electrode layer 118 may be a polysilicon layer or a metal gate electrode layer. In the illustrated embodiment, the gate electrode layer 118 is a metal gate electrode layer, which further includes multiple layers, such as a work function metal layer and a metal fill layer.

In the illustrated embodiment, the channel region 110 rises above the plane of the substrate 102 upon which it is formed and above the isolation features 106, and accordingly, circuit devices formed on the device fins 104 may be referred to as a "nonplanar" devices. The raised channel region 110 provides a larger surface area proximate to the gate stack 114 than comparable planar devices. This strengthens the electromagnetic field interactions between the gate stack 114 and the channel region 110, which may reduce leakage and short channel effects associated with smaller devices. Thus in many embodiments, FinFETs and other nonplanar devices deliver better performance in a smaller footprint than their planar counterparts.

In the illustrated embodiment, the workpiece 100 includes four device fins 104 oriented lengthwise along the Y direction, two fill fins 108 oriented lengthwise along the Y direction, and two gate stacks 114 oriented lengthwise along the X direction perpendicular to the Y direction. The workpiece 100 in FIG. 1 is provided for illustration purposes and does not necessarily limit the embodiments of the present disclosure to any number of device fins, fill fins, and gate stacks, or any configuration of structures or regions. At each intersection of the device fins 104 and the gate stacks 114, a FinFET 120 (e.g., FinFETs 120*a-h*) is formed.

The fill fins 108 extend upwardly above the device fins 104. In various embodiments, the top surfaces of the fill fins 108 and the gate stack 114 are substantially coplanar. Therefore, the fill fins 108 divide the gate stacks 114 into several segments. The FinFETs 120 on the same side of the dummy fin 108 share the gate stacks 114 in the same segment, the gate stacks of these FinFETs being electrically coupled, such as the FinFETs 120*a* and 120*b* in the illustrated embodiment. The FinFETs 120 on different sides of the fill fin 108 have the gate stacks 114 in different segments, the gate stacks of these FinFETs being electrically isolated, such as the gate stack 114 between the FinFETs 120*g* and 120*h* being divided by the dummy fin 108*b*. As fill fins may provide electrical isolation between gate stack segments, they can also be referred to as isolation fins. A difference between the fill fin 108*b* and the fill fin 108*a* is that the fill fin 108*b* has an opening 122, extending from one sidewall of the fill fin 108*b* to another sidewall of the fill fin 108*b*. The opening 122 allows the gate stack 114 to extend from the channel region 110 of a FinFET 120 on one side of the dummy fin 108*b* to the channel region 110 of another FinFET 120 on opposite side of the dummy fin 108*b*, providing electrical interconnection between these two FinFETs, such as the FinFETs 120*c* and 120*d* in the illustrated embodiment. The gate stack 114 in the opening 122 (shown as in the regions between dotted lines in FIG. 1B) can also be referred to as gate interconnect features between two adjacent FinFETs. In some embodiments, the opening 122 is opened as a hole through the sidewalls of the fill fin 108*b*, surrounded by the dummy fin 108*b* on all edges of the opening 122. In the illustrated embodiment, the opening 122 is formed on the top surface of the fill fin 108*b*. In such case, the opening 122 can be considered as a trench or a notch.

Depending on the depth of the opening 122, the bottom surface 124 of the opening 122 may be higher than the top surface 125 of the device fin 104 in one example. In yet another example, the bottom surface 124 of the opening 122 is lower than the top surface 126 of the device fin 104. In various embodiments, the opening 122 has a depth in a range of about 15 nm to about 40 nm. In some embodiments, the sidewall and bottom surfaces of the opening 122 are directly covered by the gate dielectric layer 116. In furtherance of some embodiments, the sidewalls of the dummy fins 108 are also directly covered by the gate dielectric layer 116. In the illustrated embodiment, the sidewalls of the dummy fins 108 and top surfaces and sidewalls of the device fins 104 are directly covered by an input/output (I/O) oxide layer 126. The I/O oxide layer 126 includes an oxide layer configured to provide protection from electrostatic discharge (ESD) events. The I/O oxide layer 126 may include different material compositions from the gate dielectric layer 116.

As shown in detail below, the fill fins 108*a* and 108*b* and the opening 122 may be formed before the forming of the gate stack 114, allowing the gate stack 114 to extend uniformly between channel region 110 of the FinFETs 120 and mitigating the work function metal damage caused in a conventional metal gate cut process.

Furthermore, the semiconductor structures as shown in FIG. 1 may be intermediate devices fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2A:
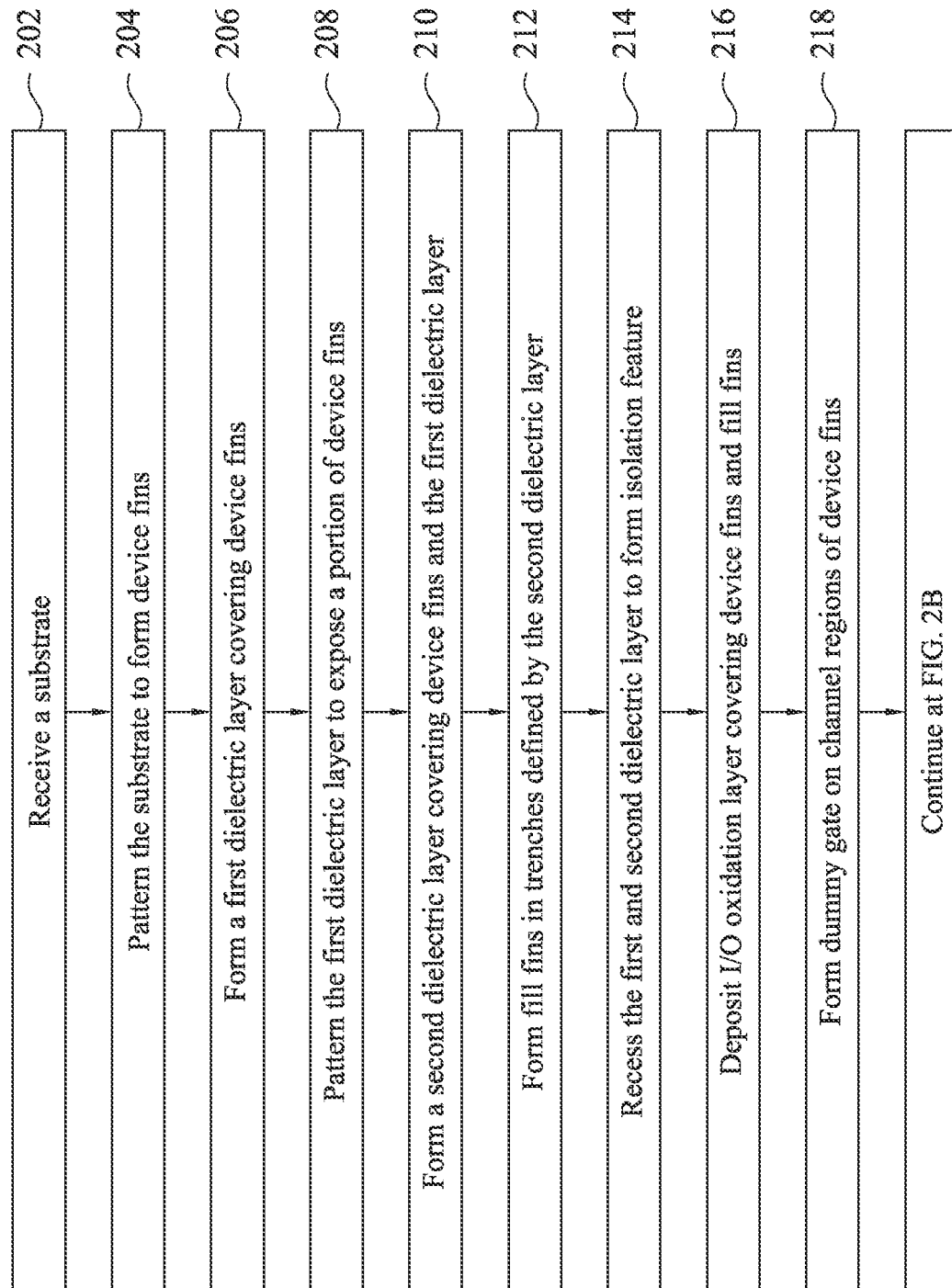
FIGS. 2A and 2B are flow diagrams of a method of fabricating a workpiece with fill fins according to various aspects of the present disclosure.
Figure 2B:
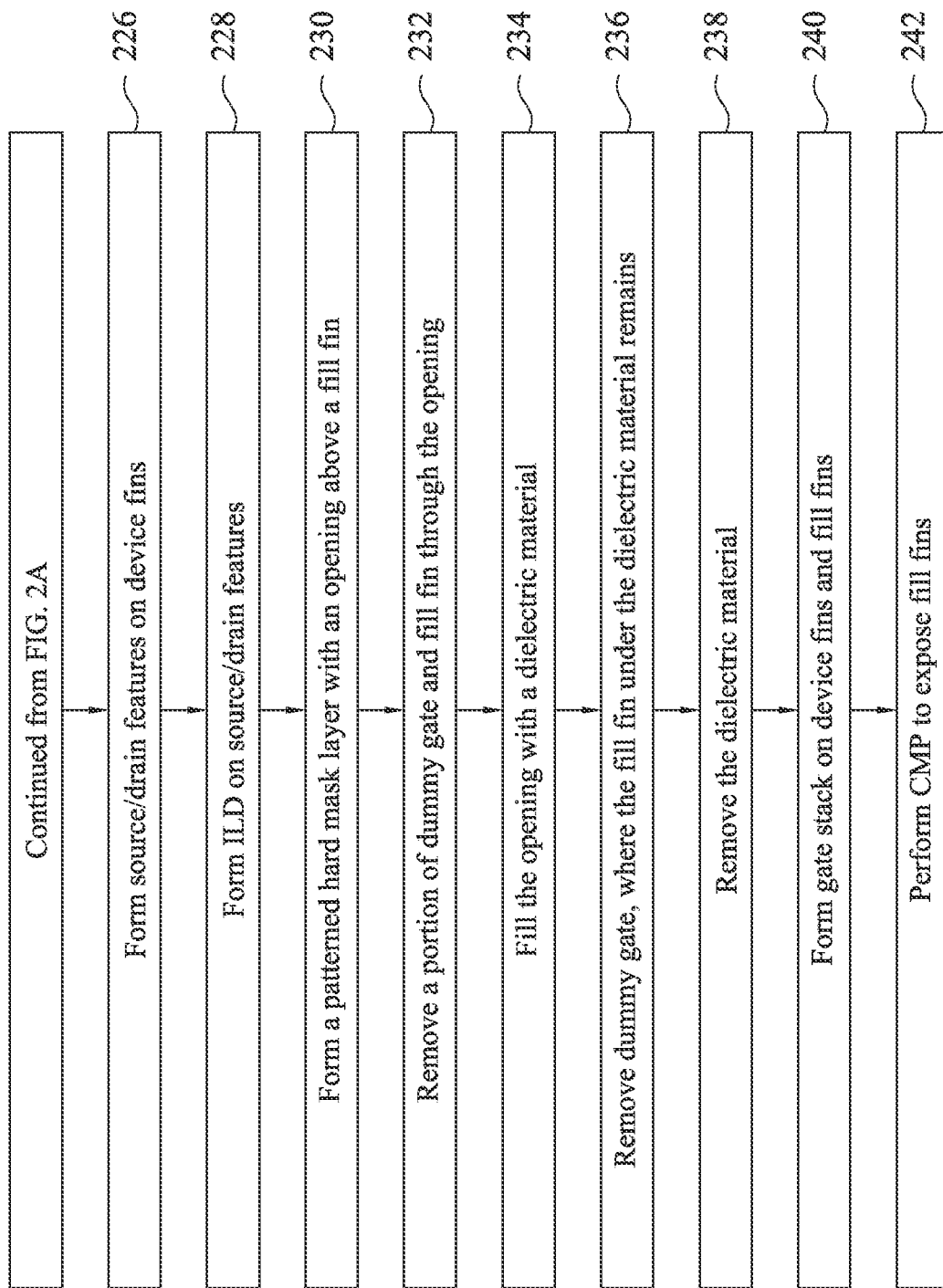

FIGS. 2A and 2B are flow diagrams of a method 200 of fabricating a workpiece 300 with dummy fins according to various aspects of the present disclosure. The workpiece 300 may be substantially similar to the workpiece 100 of FIG. 1 in many regards. Additional steps can be provided before, during, and after the method 200, and some of the steps described can be replaced or eliminated for other embodiments of the method 200. The method 200 is described below in conjunction with FIGS. 3-20B. FIGS. 3-10 show cross-sectional views of the workpiece 300 at various stages of the method 200 of fabricating a workpiece 300 with fill fins according to various aspects of the present disclosure. FIGS. 11A-11C shows a perspective view and cross-sectional views of the workpiece 300 after dummy gates are formed thereon. FIGS. 12-20B are cross-sectional views of portions of the workpiece 300 along either the channel region (e.g., along B-B' line) or the source/drain region (e.g., along C-C' line) of FIG. 11A during various stages of fabrication according to aspects of the present disclosure.

Figure 3:
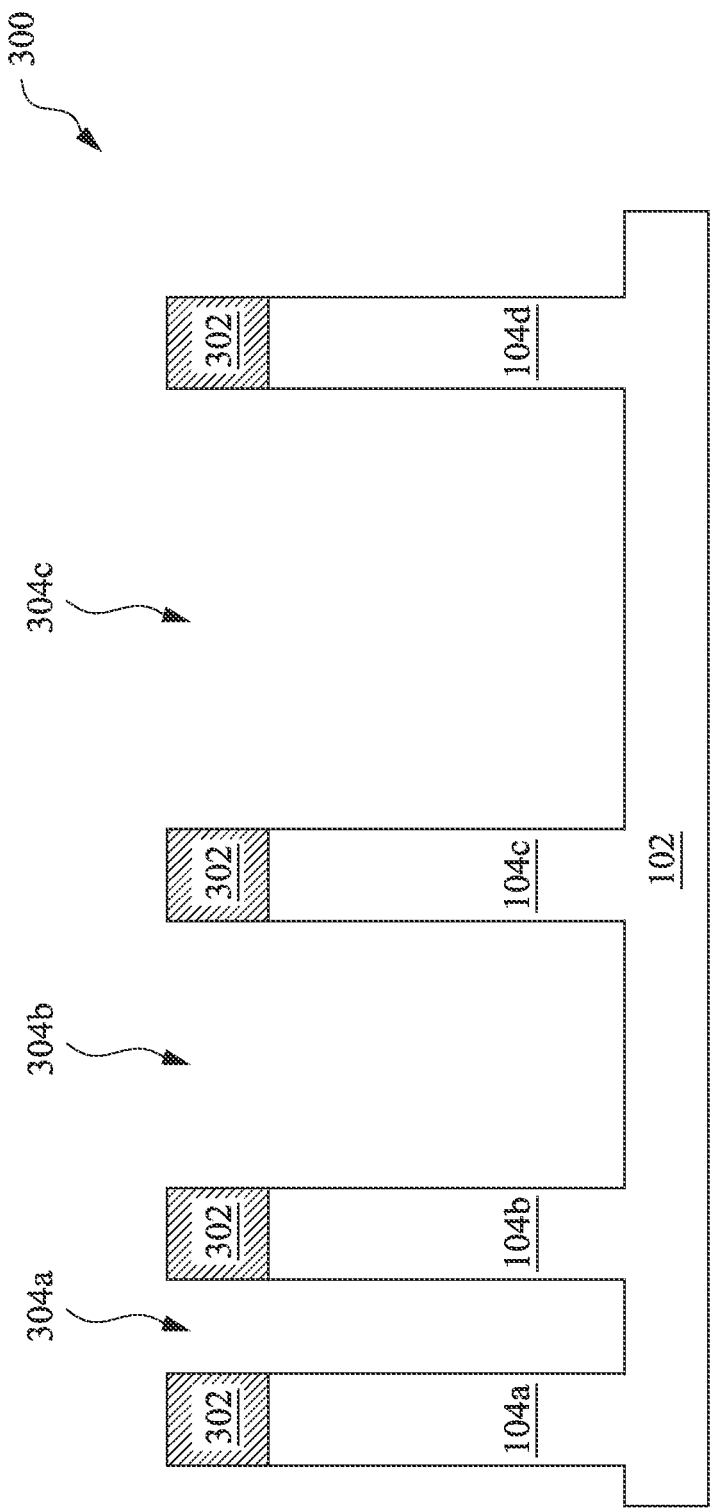
FIGS. 3, 4, 5, 6, 7, 8, 9, and 10 are cross-sectional views taken along a channel region of the workpiece at various stages of the method of fabricating the workpiece with fill fins according to various aspects of the present disclosure.

Referring first to block 202 of FIG. 2A and to FIG. 3, a workpiece 300 is received that includes a substrate 102 upon which fins are to be formed. In various examples, the substrate 102 includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof.

The substrate 102 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 102. In some such examples, a layer of the substrate 102 may include an insulator such as a silicon oxide, a silicon nitride, a silicon oxynitride, a silicon carbide, and/or other suitable insulator materials.

Referring to block 204 of FIG. 2A and referring still to FIG. 3, the method 200 patterns the substrate 102 to form one or more device fins 104 extending from the substrate 102. This may include forming a hard mask 302 on the substrate 102 and patterning the substrate 102 to define the device fins 104. The hard mask 302 may include a dielectric such as a silicon oxide, a silicon nitride, a silicon oxynitride, and/or a silicon carbide, and in an exemplary embodiment, the first hard mask 302 includes silicon nitride. The hard mask 302 may be formed to any suitable thickness and by any suitable process including thermal growth, chemical vapor deposition (CVD), high-density plasma CVD (HDP-CVD), physical vapor deposition (PVD), atomic-layer deposition (ALD), and/or other suitable deposition processes.

To pattern the hard mask 302, block 204 may include a variety of processes such as photolithography and etching. The photolithography process may include forming a photoresist (not shown) over the substrate 102. An exemplary photoresist includes a photosensitive material sensitive to radiation such as UV light, deep ultraviolet (DUV) radiation, and/or EUV radiation. A lithographic exposure is performed on the workpiece 300 that exposes selected regions of the photoresist to radiation. The exposure causes a chemical reaction to occur in the exposed regions of the photoresist. After exposure, a developer is applied to the photoresist. The developer dissolves or otherwise removes either the exposed regions in the case of a positive resist development process or the unexposed regions in the case of a negative resist development process. Suitable positive developers include TMAH (tetramethyl ammonium hydroxide), KOH, and NaOH, and suitable negative developers include solvents such as n-butyl acetate, ethanol, hexane, benzene, and toluene. After the photoresist is developed, the exposed portions of the hard mask 302 may be removed by an etching process, such as wet etching, dry etching, Reactive Ion Etching (RIE), ashing, and/or other etching methods, resulting in a patterned hard mask 302. After etching, the photoresist may be removed.

Subsequently, the substrate 102 is etched using the patterned hard mask 302 to define the device fins 104. The etching processes may include any suitable etching technique such as wet etching, dry etching, RIE, ashing, and/or other etching methods. In some embodiments, etching includes multiple etching steps with different etching chemistries, each targeting a particular material of the substrate 102 and each selected to resist etching the hard mask 302. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The remaining portions of the semiconductor layers become the device fins 104, defining the trenches 304 between the device fins 104, such as the trenches 304a-c in the illustrated embodiment.

In the illustrated embodiment, the hard mask 302 defines four device fins 104 with varied spacing therebetween, although in further examples, the hard mask 302 may define any number of device fins 104 with any suitable spacing. In areas where device fins have wide spacing, fin density becomes low, such as between the device fins 104b, 104c, and 104d. To address this, fill fins may be formed in such areas to increase fin density. One of the benefits of a higher fin density is that it provides better support for the device fins and features to be formed above the device fins, such as S/D contacts metal, which might otherwise suffer from metal pulling into regions between widely separated device fins. The subsequent processes form fill fins between device fins 104 as shown in blocks 206-212.

Figure 4:
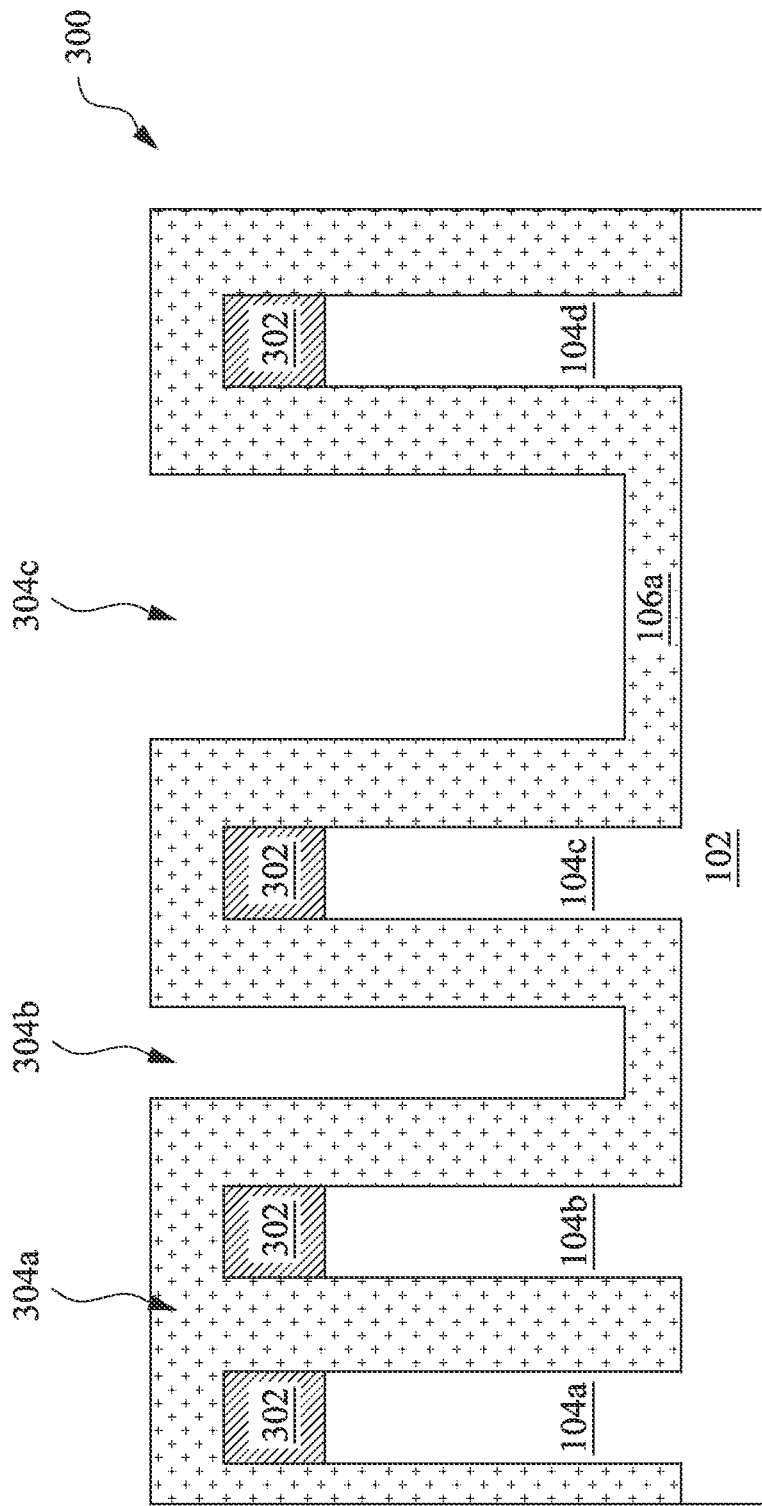

Referring to block 206 of FIG. 2A and to FIG. 4, the trenches 304 are filled with a dielectric material to form an isolation feature 106, such as a shallow trench isolation feature (STI). The isolation feature 106 may include multiple layers, such as the first isolation feature layer 106a depicted in FIG. 4 as one of the multiple layers. Suitable dielectric materials for the first isolation feature layer 106a include silicon oxides, silicon nitrides, silicon carbides, FluoroSilicate Glass (FSG), low-K dielectric materials, and/or other suitable dielectric materials. The dielectric material may be deposited by any suitable technique including thermal growth, CVD, HDP-CVD, PVD, ALD, and/or spin-on techniques. In the illustrated embodiment, the first isolation feature layer 106a is deposited as a conformal layer, covering each of the device fins 104. Conformal deposition techniques may be used, such as an ALD process.

The width of the trenches 304 becomes narrower after the deposition of the first isolation feature layer 106a. As will be shown below, fill fins will be formed in some of these trenches. In contrast, some trenches between device fins 104 with relatively narrow spacing may be filled up by the first isolation feature layer 106a, such as the trench 304a, and thus no fill fin is formed in this trench. Some trenches may have a reduced width substantially the same with a width of the device fin 104, such as the trench 304b. Some trenches between device fins 104 with relatively wide spacing may still have large gap, such as the trench 304c. Extra layers of the isolation feature 106 may be filled in the trenches 304c to further reduce the gap, such as the second isolation feature layer 106b to be depicted below. Extra layers of the isolation feature 106 also helps to define positions of the fill fins in the trenches.

Figure 5:
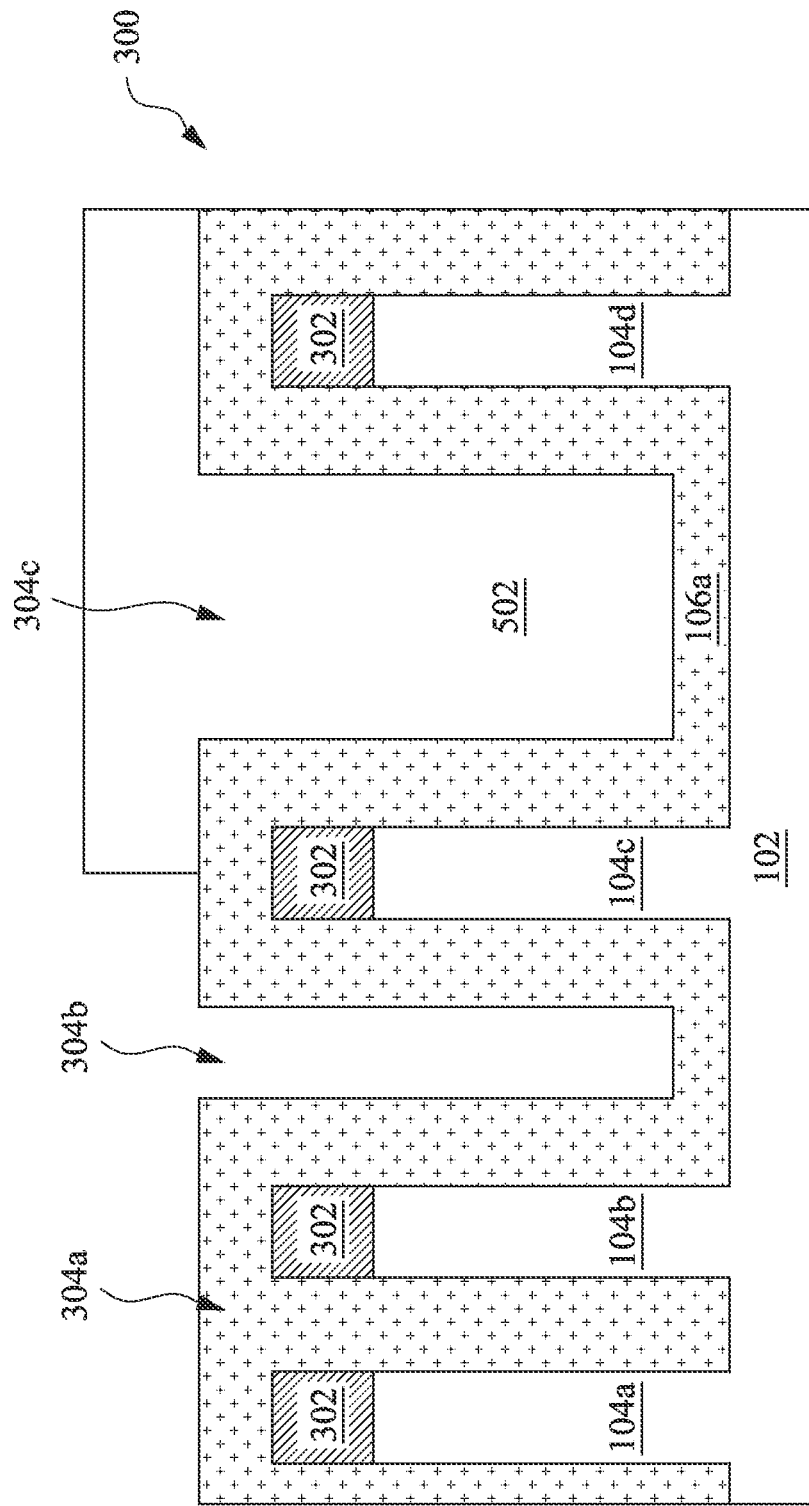

Referring to block 208 of FIG. 2A and to FIG. 5, a patterned dielectric material 502 is formed on the workpiece 300, covering the trench 304c in order to deposit extra layers of the isolation feature 106 inside. Suitable dielectric materials for the dielectric material 502 include silicon oxides, silicon nitrides, silicon carbides, and/or other suitable dielectric materials. The dielectric material 502 is selected that exhibits etching selectivity from the first isolation feature layer 106a. The dielectric material 502 may be deposited by any suitable technique including thermal growth, CVD, HDP-CVD, PVD, ALD, and/or spin-on techniques. In one such embodiment, a CVD process is used to deposit a flowable dielectric material that includes both a dielectric component and a solvent in a liquid or semiliquid state. A curing process is used to drive off the solvent, leaving behind the dielectric material 502 in its solid state. Following the deposition, a Chemical Mechanical Planarization (CMP) process may be performed to remove the excess dielectric material. A photolithography process may be performed to pattern the dielectric material 502. The photolithography process includes forming a photoresist over the dielectric material 502, exposing the photoresist to a pattern that defines various geometrical shapes, performing post-exposure bake processes, and developing the photoresist to form the masking element. After the photoresist is developed, the exposed portions of the dielectric material 502 may be removed by an etching process, such as wet etching, dry etching, RIE, ashing, and/or other etching methods. After etching, the photoresist may be removed. The patterned dielectric material 502 exposes a portion of the first isolation feature layer 106a.

Figure 6:
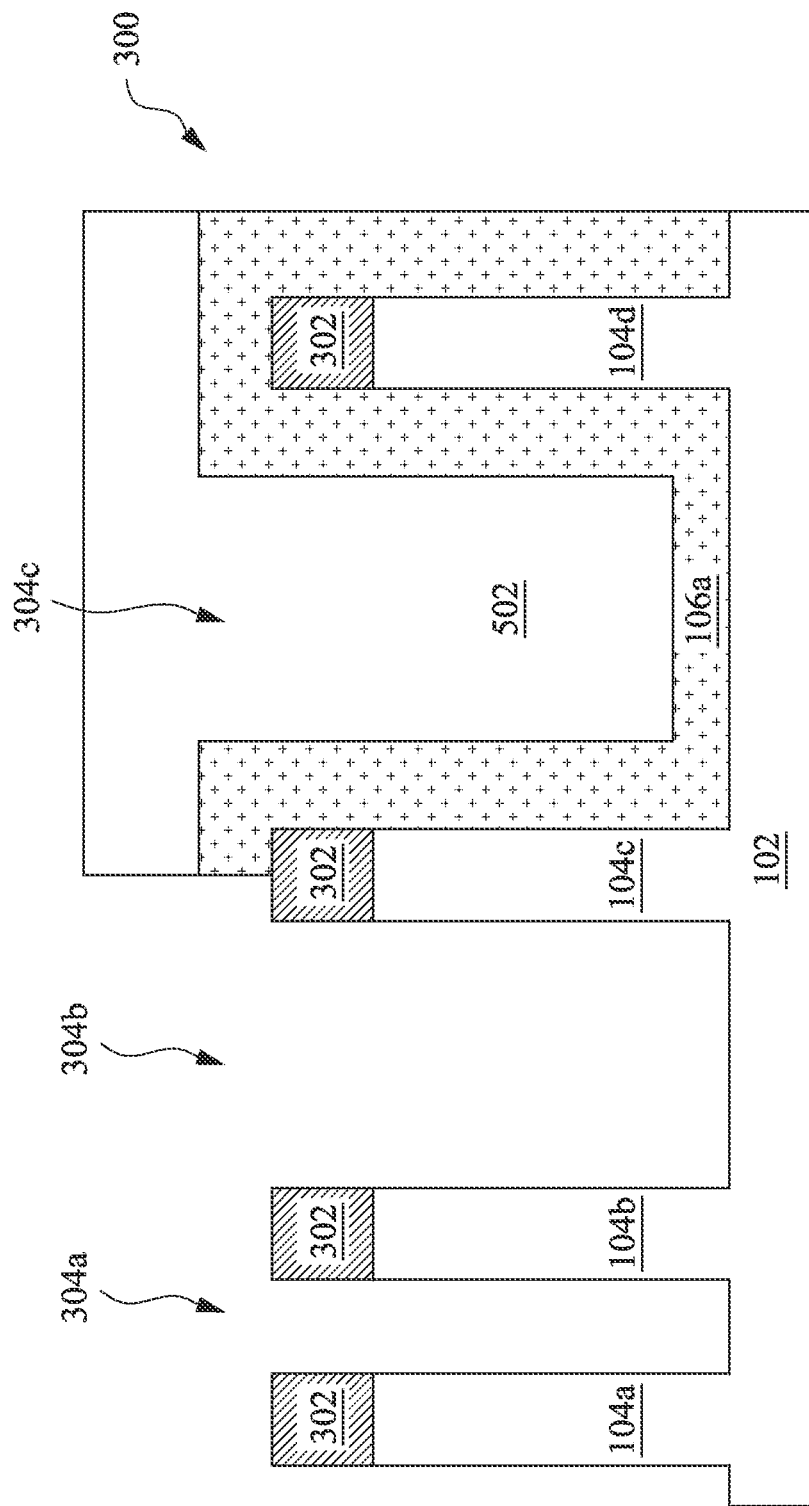

Referring to block 208 of FIG. 2A and to FIG. 6, the exposed portion of the first isolation feature layer 106a is removed by an etching process, such as wet etching, dry etching, RIE, ashing, and/or other etching methods. By selecting an etchant that targets a material composition of the first isolation feature layer 106a while resist etching of the dielectric material 502, the trench 304c remains covered by the dielectric material 502 and the device fins 104 adjacent the trenches 304a and 304b are exposed. After the exposed portion of the first isolation feature layer 106a is removed, the dielectric material 502 is removed by a suitable etchant.

Figure 7:
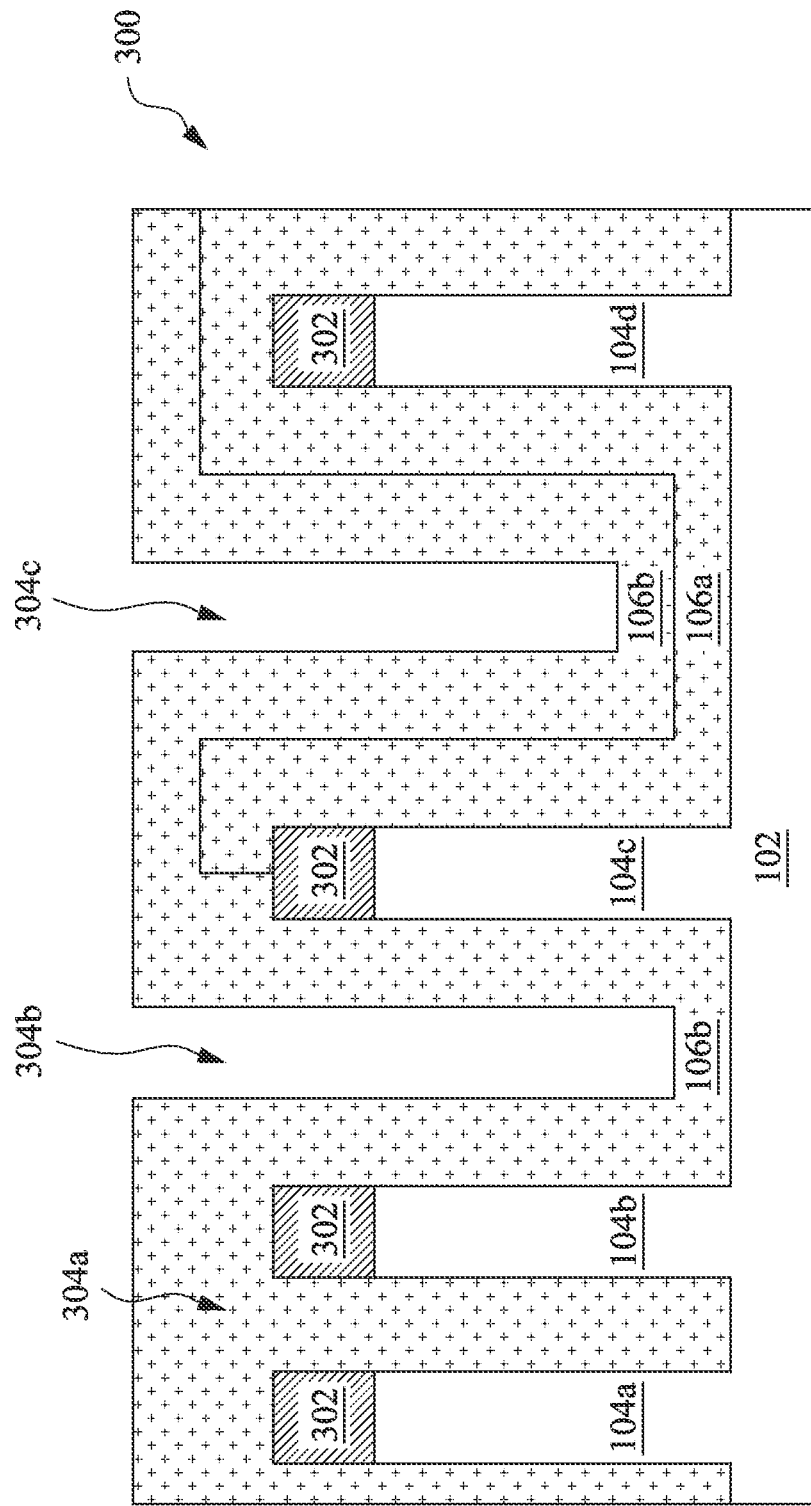

Referring to block 210 of FIG. 2A and to FIG. 7, the second isolation feature layer 106b is formed above the workpiece 300, covering the exposed device fins 104 and the remained first isolation feature layer 106a. Suitable dielectric materials for the second isolation feature layer 106b include semiconductor oxides, semiconductor nitrides, semiconductor carbides, FluoroSilicate Glass (FSG), low-K dielectric materials, and/or other suitable dielectric materials. The dielectric material may be deposited by any suitable technique including thermal growth, CVD, HDP-CVD, PVD, ALD, and/or spin-on techniques. In many regards, the second isolation feature layer 106b may be substantially similar to the first isolation feature layer 106a, and a similar deposition process may be performed on the workpiece 300 to deposit the second isolation feature layer 106b. In the illustrated embodiment, the second isolation feature layer 106b includes the same material composition as the first isolation feature layer 106a and is deposited by a conformal deposition technique, such as an ALD process. In yet another embodiment, the first and second isolation feature layers 106a and 106b include different material compositions. As an example, the first isolation feature 106a may include silicon oxide while the second isolation feature layer 106b may include silicon nitride, or the first isolation feature 106a may include silicon nitride while the second isolation feature layer 106b may include silicon carbide. The width of the trench 304c is further reduced after the deposition of the first and second isolation features layers 106a and 106b. The reduced width of the trench 304c may become close to the width of the device fins 104.

Figure 8:
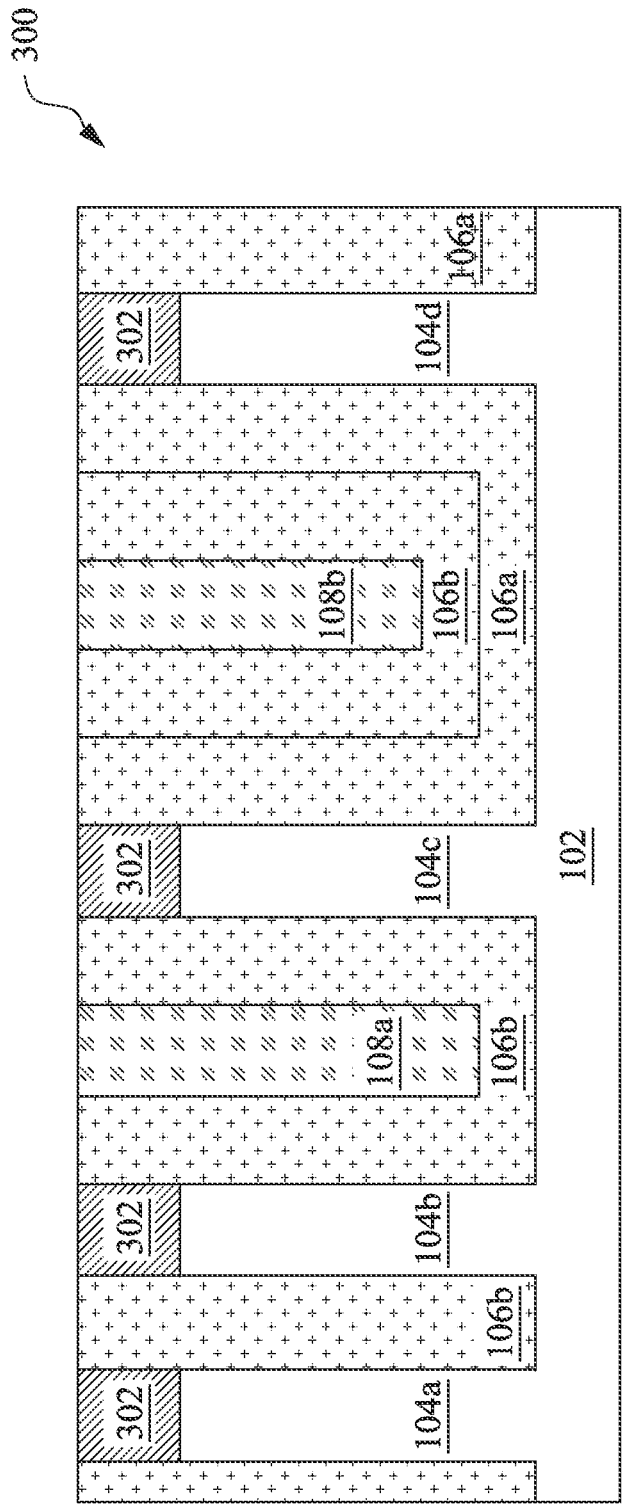

Referring to block 212 of FIG. 2A and to FIG. 8, fill fins 108 are deposited in the trenches 304, such as the fill fin 108a in the trench 304b and the fill fin 108b in the trench 304c. The fill fin 108b may have a bottom surface higher than the fill fin 108a due to the extra layer of the isolation feature layer 106a inserted between the isolation feature layer 106b and the substrate 102. The fill fins 108a and 108b may include any suitable dielectric material including silicon carbide nitride, silicon carbide oxynitride, and metal oxide, such as hafnium oxide, zirconium oxide, and aluminum oxide, and/or other suitable dielectric materials, and may be deposited by any suitable deposition process including thermal growth, CVD, HDP-CVD, PVD, ALD, and/or other suitable processes. In an example, the fill fins 108 includes aluminum oxide ($Al_2O_3$) deposited by CVD. In some embodiments, the fill fins 108 have substantially the same width as the device fins 104. Following the deposition, a CMP process may be performed to remove excess dielectric material. In some embodiments, the hard mask 302 may function as a CMP stop layer.

Figure 9:
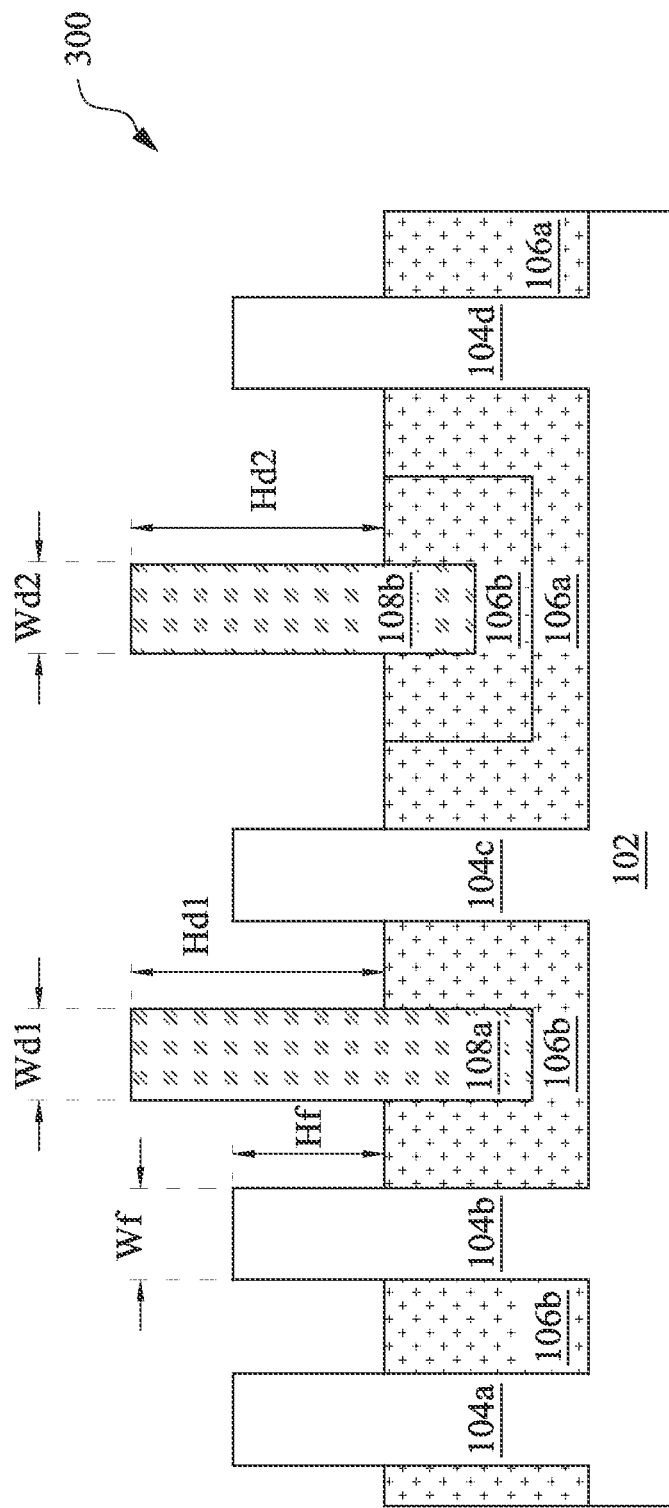

Referring to block 214 of FIG. 2A and to FIG. 9, the isolation features 106 are recessed. In the illustrated embodiment, the isolation features 106 include the first isolation feature layer 106a and the second isolation feature layer 106b. Any suitable etching technique may be used to recess the isolation features 106 including dry etching, wet etching, RIE, and/or other etching methods, and in an exemplary embodiment, an anisotropic dry etching is used to selectively remove the dielectric material of the isolation features 106 without etching the device fins 104 and the fill fins 108. The hard mask 302 may also be removed before, during, and/or after the recessing of the isolation features 106. In some embodiments, the hard mask 302 is removed by a CMP process performed prior to the recessing of the isolation features 106. In some embodiments, the hard mask 302 is removed by an etchant used to recess the isolation features 106. After bock 214, the device fins 104 and the fill fins 108 extend upwardly from the recessed isolation features 106. The heights of the fill fins 108a and 108b above the isolation features 106 are denoted as $H_{d1}$ and $H_{d2}$, respectively. The height of the device fins 104 is denoted as $H_f$. $H_{d1}$ and $H_{d2}$ are both higher than $H_f$. For example, the ratio $H_{d1}/H_f$ may be ranging from about 1.1 to about 1.5. The width $W_{d1}$ and $W_{d2}$ of the respective fill fins 108a and 108b may be substantially the same with the width $W_f$ of the device fins 104, such as from about 4 nm to about 8 nm. In some embodiments, $W_{d2}$ may be larger than $W_{d1}$, due to a larger trench width of the trench 304c (FIG. 7) inside which the fill fin 108b has been formed. For example, the ratio $W_{d2}/W_{d1}$ is greater than 1.5, such as ranging from 2 to 3.

Figure 10:
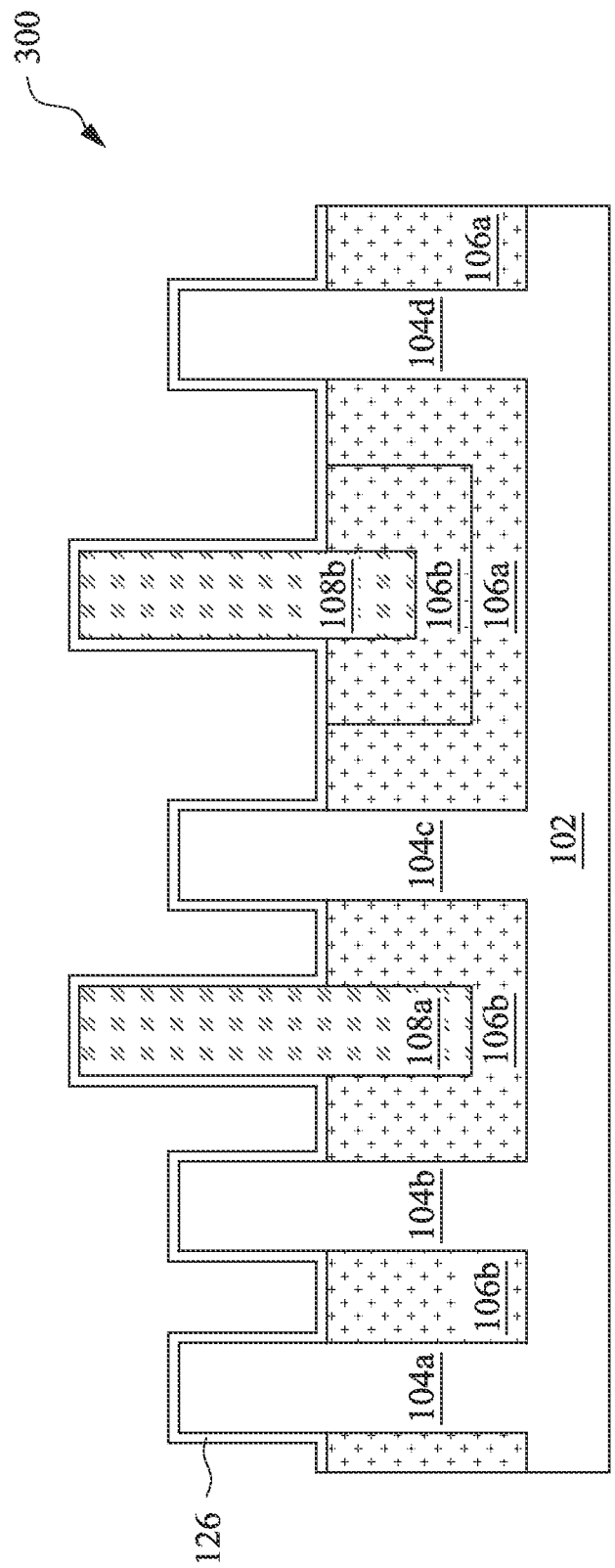
Figure 11A:
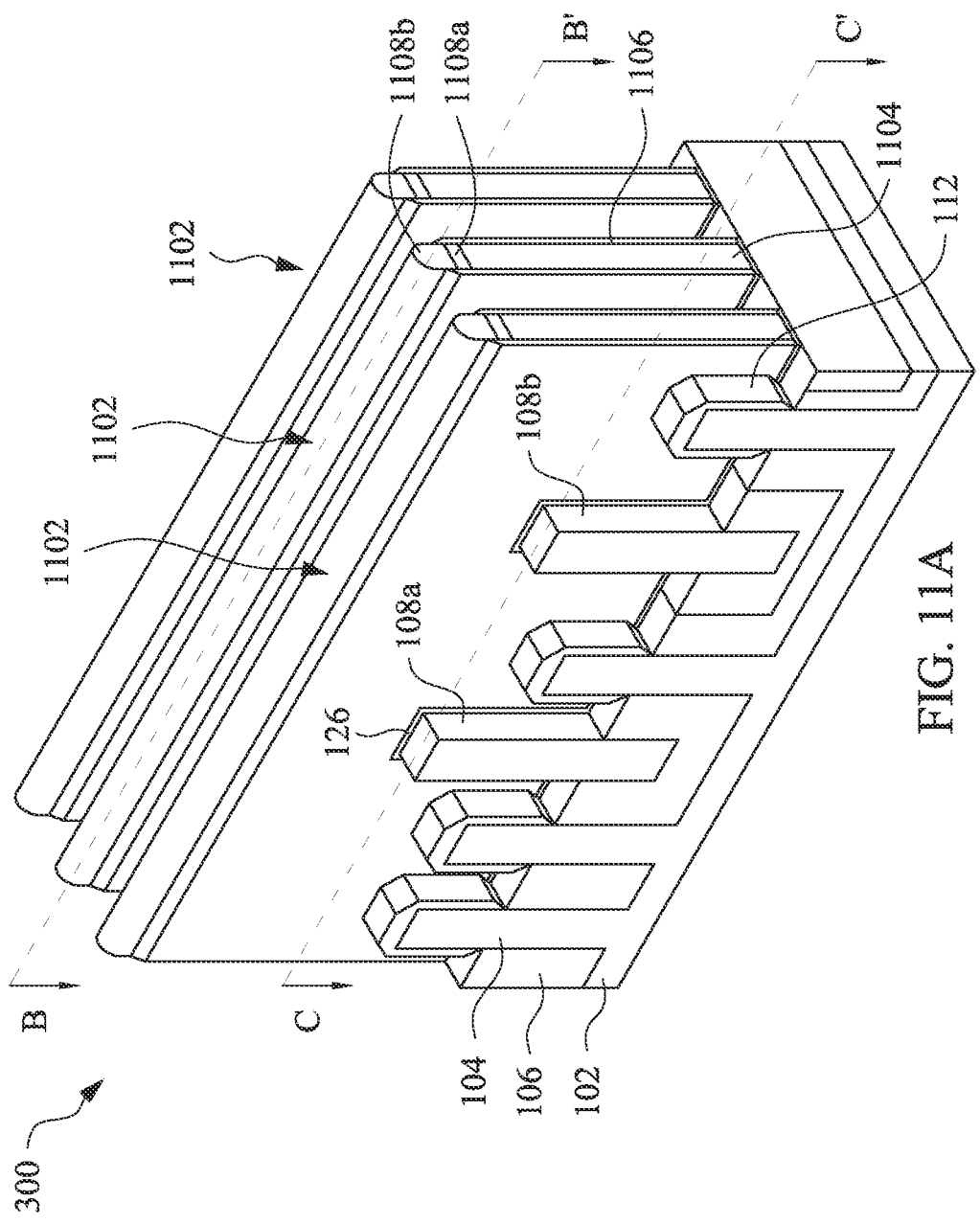
FIG. 11A is a perspective view of the workpiece at a stage of the method of fabricating the workpiece with fill fins according to various aspects of the present disclosure.
Figure 11B:
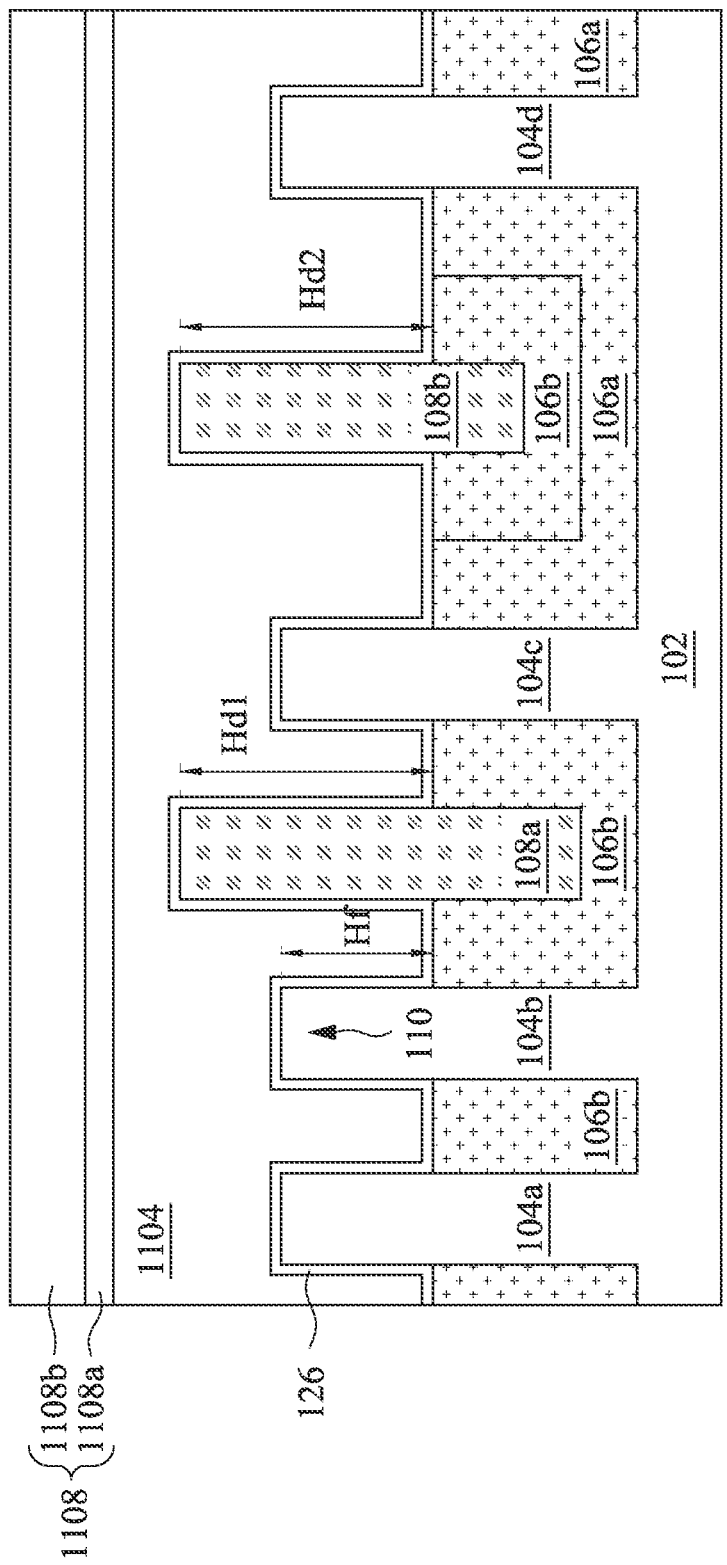
FIGS. 11B, 12, 14, 15, 16, 17, 18, 19, 20A are cross-sectional views taken along the channel region of the workpiece in FIG. 11A at various stages of the method of fabricating the workpiece with the fill fins according to various aspects of the present disclosure.
Figure 11C:
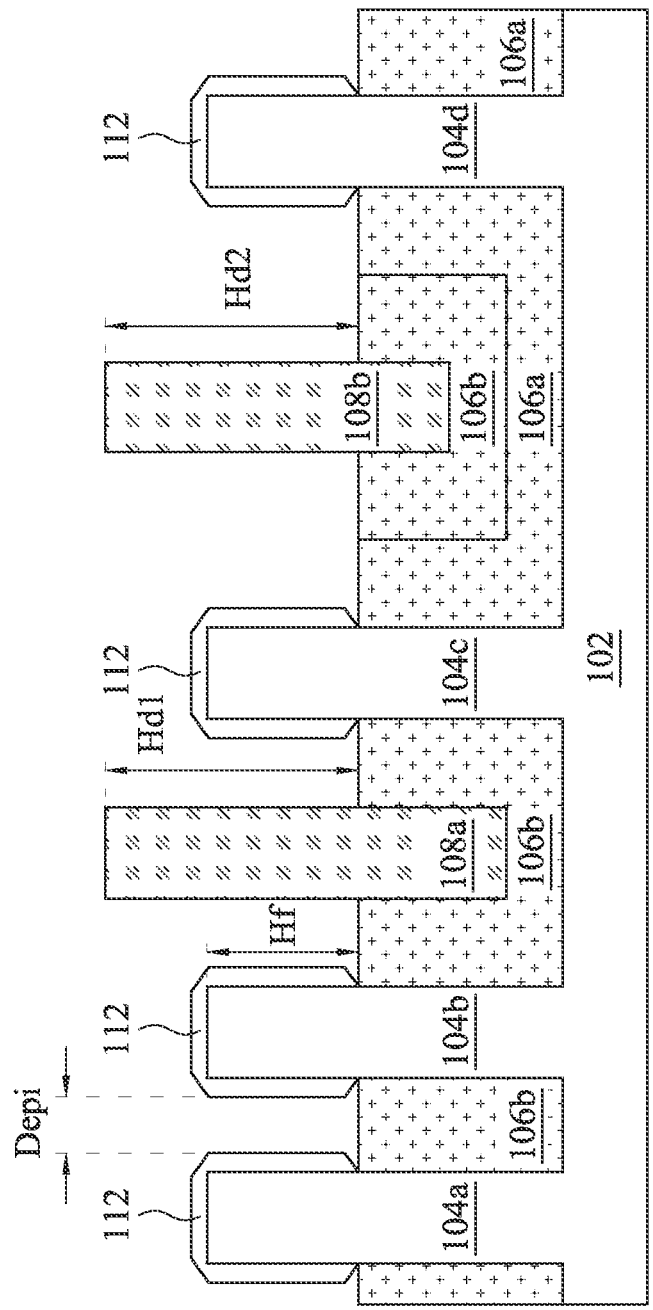
FIGS. 11C, 13, 20B, 21 are cross-sectional views taken along the source/drain region of the workpiece in FIG. 11A at various stages of the method of fabricating the workpiece with the fill fins according to various aspects of the present disclosure.

Referring to block 216 of FIG. 2A and to FIG. 10, an input/output (I/O) oxide layer 126 is formed on the workpiece 300. In some embodiments, the I/O oxide layer 126 includes an oxide layer configured to provide protection from electrostatic discharge (ESD) events. The I/O oxide layer 126 may be formed as a blanket layer covering the device fins 104 and the fill fins 108 by any suitable technique including thermal growth, CVD, PVD, and ALD. In the illustrated embodiment, the I/O oxide layer 126 includes silicon dioxide and is deposited by a conformal deposition technique, such as an ALD process.

A dummy gate (which may also be referred to as a sacrificial gate) may then be formed over a channel region 110 of the device fins 104. Referring to block 218 of FIG. 2A and referring to FIG. 11A, a dummy gate 1102 is formed on the channel region 110. FIGS. 11B and 11C refer to cross-sections taken through the channel region (e.g., along B-B' line) and source/drain region (e.g., along C-C' line), respectively, to better illustrate the underlying features. The dummy gate 1102 may reserve an area for a metal gate stack and may include a dummy gate layer 1104, gate spacers 1106, a dummy gate hard mask 1108, and/or other components. Accordingly, in some embodiments, forming the dummy gate 1102 includes depositing the dummy gate layer 1104 containing polysilicon or other suitable material and depositing the dummy gate hard mask 1108 on the dummy gate layer 1204, and then patterning the dummy gate layer 1104 and the dummy gate hard mask 1108 in a lithographic process. The dummy gate hard mask 1108 may include any suitable material, such as silicon oxide, silicon nitride, silicon carbide, silicon oxynitride, other suitable materials, and/or combinations thereof. In some embodiments, the dummy gate hard mask 1108 may include multiple hard mask layers, such as a first hard mask layer 1108a and a second hard mask layer 1108b. The first hard mask layer 1108a and the second hard mask layer 1108b may include different material compositions.

In some embodiments, gate spacers 1106 are formed on each side of the dummy gate (on the sidewalls of the dummy gate layer 1104 and/or dummy gate hard mask 1108). The gate spacers 1106 may be used to offset the subsequently formed source/drain features and may be used for designing or modifying the source/drain structure (junction) profile. The gate spacers 1106 may include any suitable dielectric material, such as silicon oxide, silicon nitride, silicon carbide, silicon oxynitride, other suitable materials, and/or combinations thereof.

Referring to block 226 of FIG. 2B and to FIGS. 11A and 11C, an epitaxial process is performed to form source/drain features 112 on the substrate 102 in the source/drain regions of the device fins 104. Prior to the epitaxial process, an etching process may be performed to remove the I/O oxide layer 126 exposed in regions that are not covered by the dummy gate 1102 and the gate spacers 1106. The etching process may include wet etching, dry etching, and/or other suitable etching methods. During the epitaxial process, the dummy gate 1102 and/or gate spacers 1106 limit the source/drain features 112 to the source/drain regions. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which interact with the composition of the substrate 102. In some embodiments, adjacent source/drain features 112, such as the source/drain features 112 grown on device fins 104a and 104b, are spaced from each other with a distance $D_{epi}$ (i.e., $D_{epi}>0$). In some embodiments, adjacent source/drain features 112 are epitaxially grown in a way that they are connected (i.e., $D_{epi}=0$). In yet another embodiment, the heights of the fill fins 108a and 108b in the source/drain region ($H_{d1}'$ and $H_{d2}'$) are recessed to substantially the same height as the height of the device fins 104 in the source/drain regions (Hf') by an etching process, while the respective heights in the channel region ($H_{d1}$ and $H_{d2}$) remains unchanged. Furthermore, the height of the device fins 104 in the source/drain regions (Hf') may also be recessed before epitaxially growing the source/drain features 112. As an example, the device fins 104 in the source/drain regions may become lower than the top surface of the isolation features 106, and source/drain features 112 extend upwardly from the top surfaces of the device fins 104 to above the isolation features 106.

The source/drain features 112 may be in-situ doped during the epitaxial process by introducing doping species including: p-type dopants, such as boron or $BF_2$; n-type dopants, such as phosphorus or arsenic; and/or other suitable dopants including combinations thereof. If the source/drain features 112 are not in-situ doped, an implantation process (i.e., a junction implant process) is performed to dope the source/drain features 112. In an exemplary embodiment, the source/drain features 112 in an NMOS device include SiP, while those in a PMOS device include GeSnB (tin may be used to tune the lattice constant) and/or SiGeSnB. One or more annealing processes may be performed to activate the source/drain features 112. Suitable annealing processes include rapid thermal annealing (RTA) and/or laser annealing processes.

Figure 12:
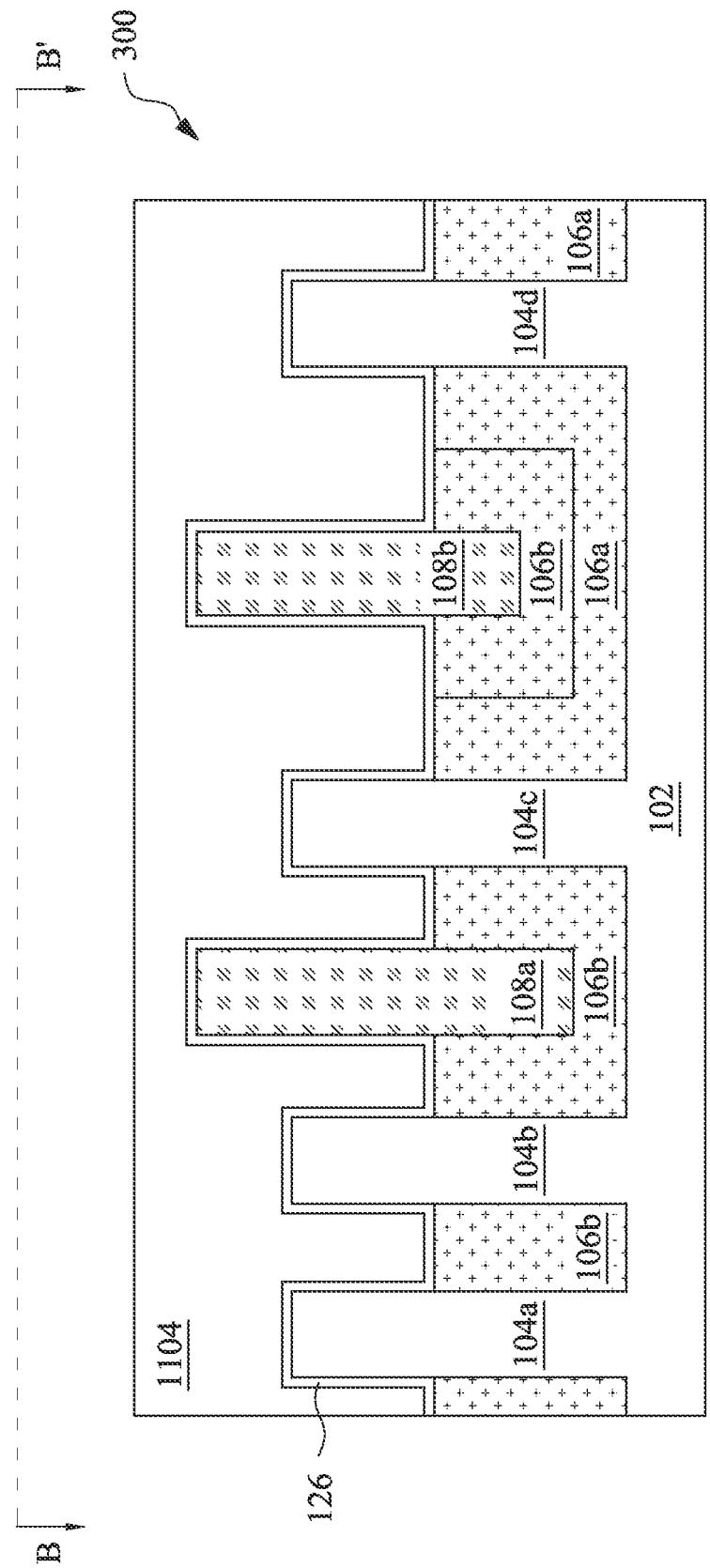
Figure 13:
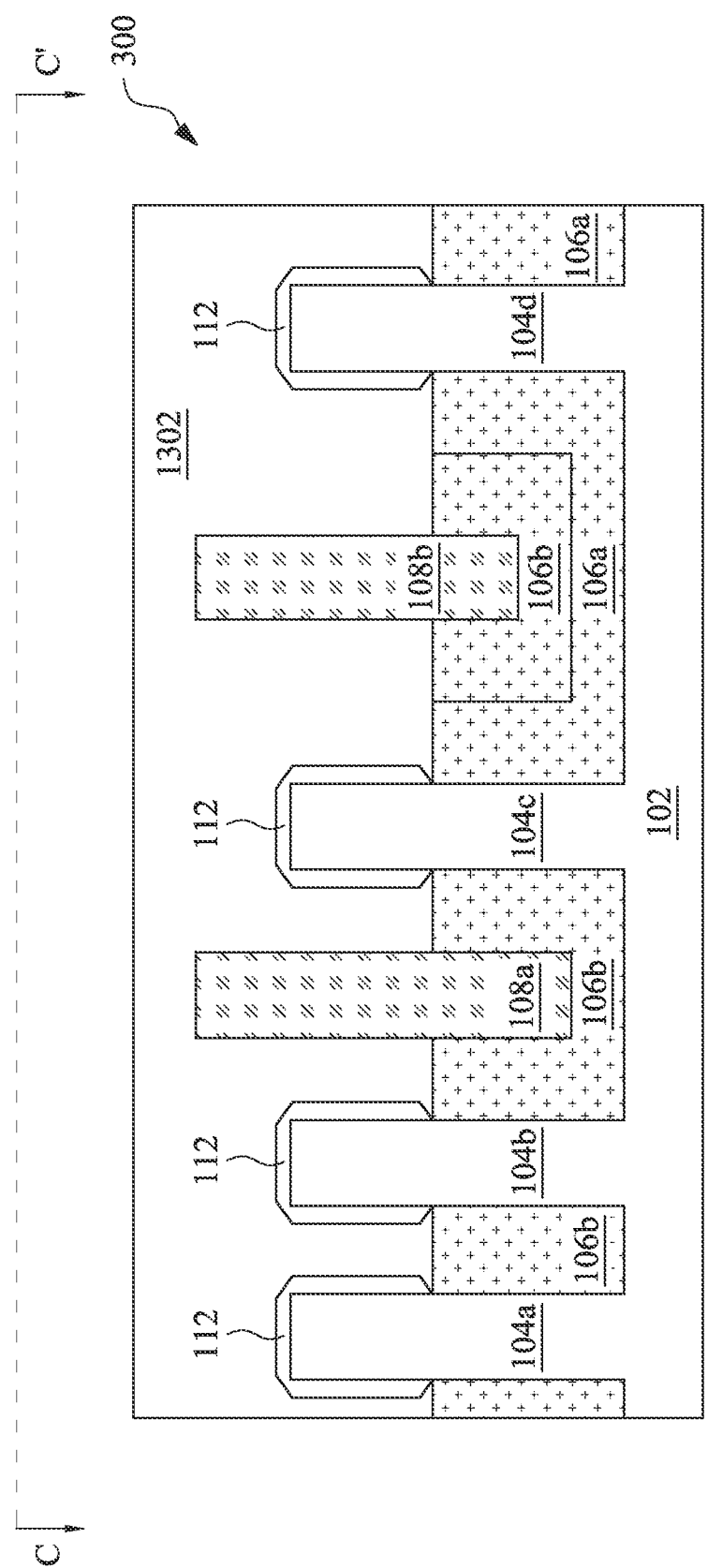

Referring to block 228 of FIG. 2B and to FIGS. 12 and 13, an inter-layer dielectric (ILD) layer 1302 is formed on the source/drain features 112 in the source/drain regions. The ILD layer 1302 may be part of an electrical multi-layer interconnect (MLI) structure that electrically interconnects the devices of the workpiece including the FinFET devices formed on the device fins 104. In such embodiments, the ILD layer 1302 acts as an insulator that supports and isolates conductive traces of the MLI structure. The ILD layer 1302 may include any suitable dielectric material, such as silicon oxide, doped silicon oxide such as borophosphosilicate glass (BPSG), tetraethylorthosilicate (TEOS) oxide, un-doped silicate glass, fused silica glass (FSG), phosphosilicate glass (PSG), boron doped silicon glass (BSG), silicon nitride, silicon oxynitride, silicon carbide, low-k dielectric material, other suitable materials, and/or combinations thereof. The ILD layer 1302 may be deposited by a PECVD process, a flowable CVD (FCVD) process, or other suitable deposition technique. A CMP process may follow block 228 to remove excessive dielectric materials. In some embodiments, the CMP process also removes the dummy gate hard mask 1108 and exposes the dummy gate layer 1104, as shown in FIG. 12.

Figure 14:
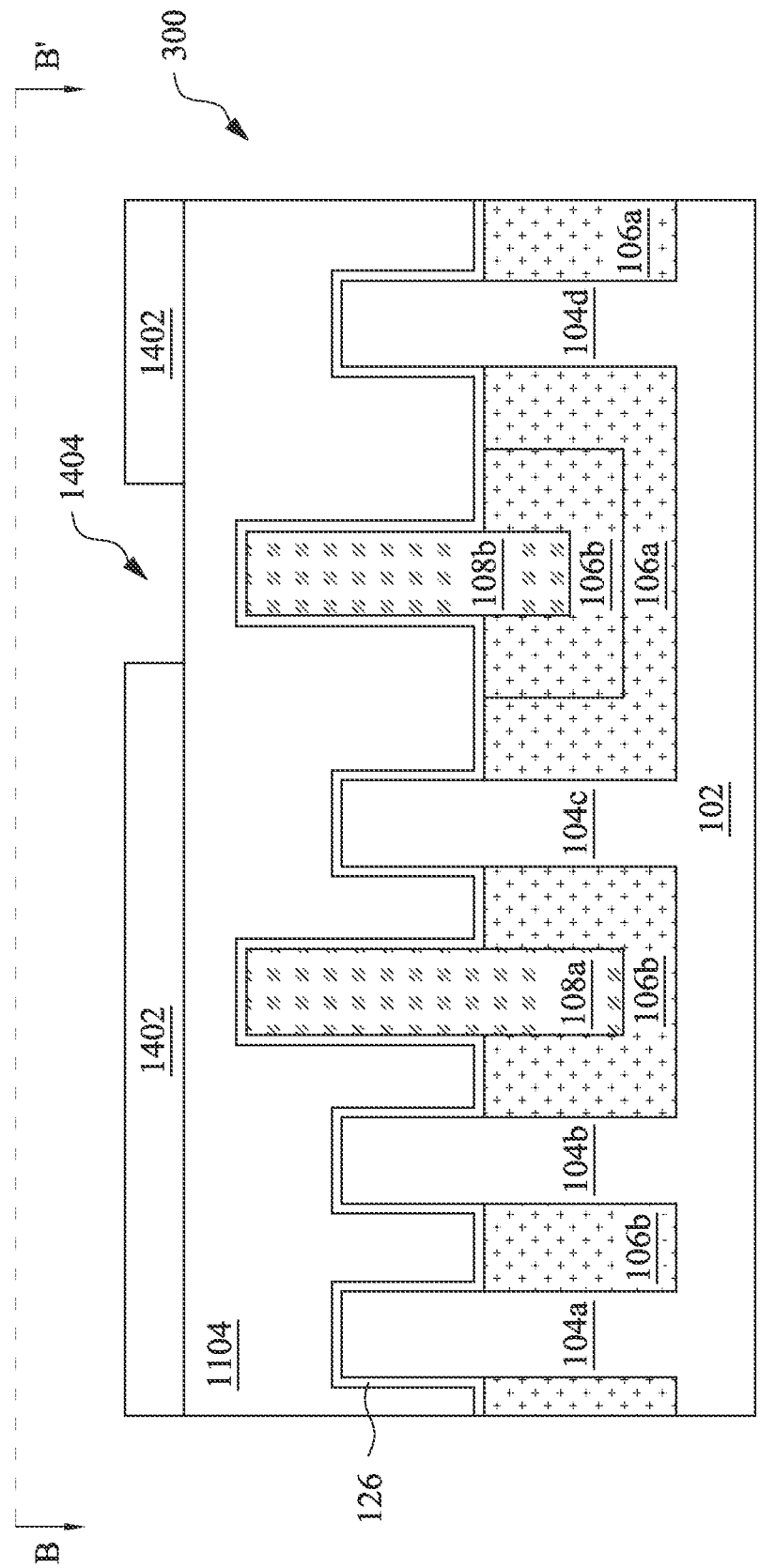

Referring to block 230 of FIG. 2B and to FIG. 14, a hard mask 1402 is formed on the workpiece 300 and patterned to have an opening 1404 above the fill fin 108b. The hard mask 1402 may be deposited by any suitable process including CVD, HDP-CVD, ALD, PVD, and/or other suitable deposition techniques. The hard mask 1402 may include any suitable material, such as silicon oxide, silicon nitride, silicon oxynitride, silicon carbide, or a combination thereof. The patterning of the hard mask 1402 includes a photolithography process and an etching process. The photolithography process may include forming a photoresist over the hard mask 1402, exposing the resist to a pattern that defines an opening above the fill fin 108b, performing post-exposure bake processes, and developing the resist to form a masking element. The masking element, or a derivative thereof, is then used for etching the hard mask 1402. The masking element (e.g., a patterned resist) is subsequently removed. The etching processes may include one or more dry etching processes, wet etching processes, and other suitable etching techniques.

Figure 15:
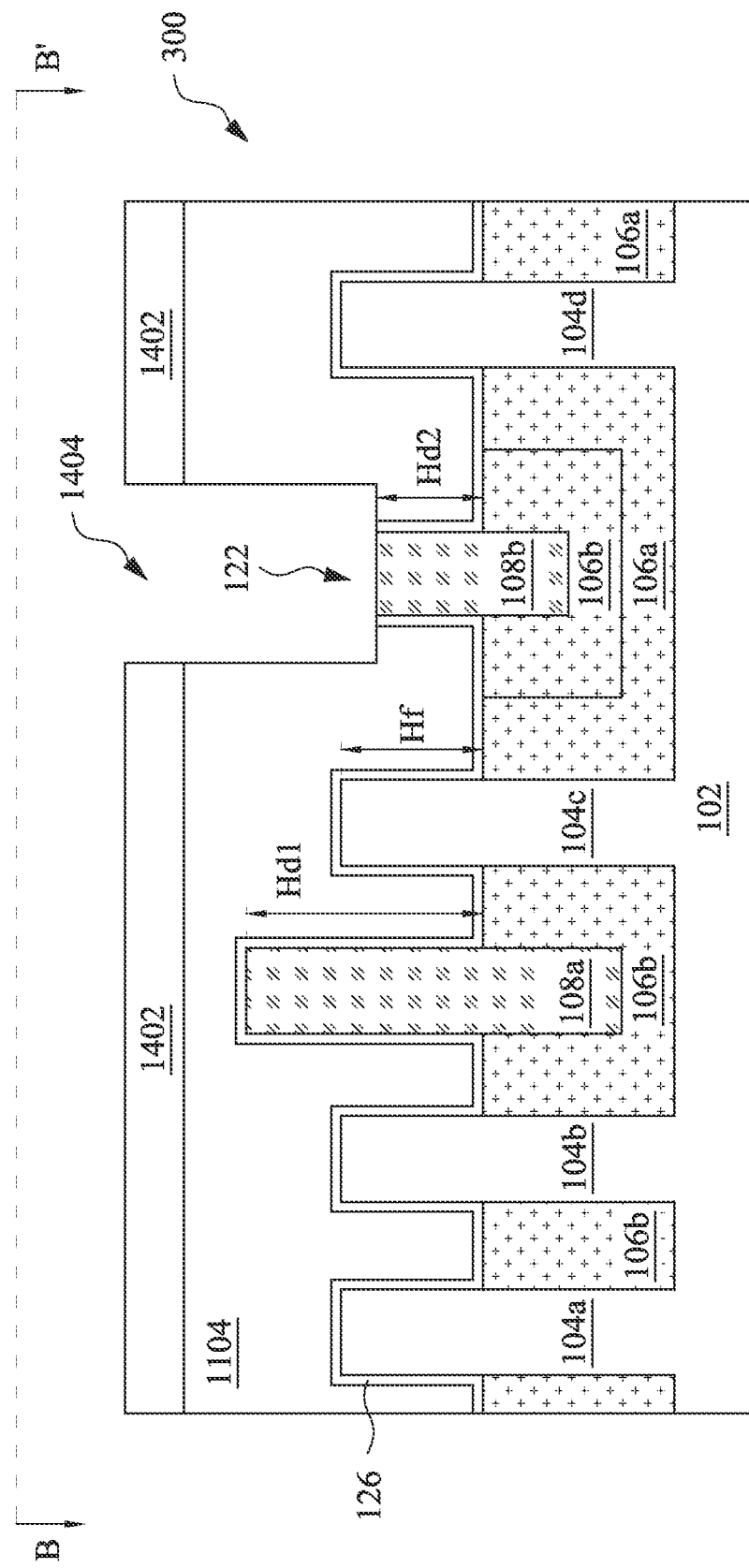

Referring to block 232 of FIG. 2B and to FIG. 15, a portion of the dummy gate layer 1104 is etched through the opening 1404 of the patterned hard mask 1402. The etching process extends the opening 1404 downwardly to the fill fin 108b, resulting in a trench 122. A portion of the I/O oxide layer 126 covering the fill fin 108b and a top portion of the fill fin 108b are also removed in the etching process. By selecting an etchant that resists etching the gate spacers 1106 and ILD layer 1302, in some embodiments, portions of the gate spacers 1106 and ILD layer 1302 adjacent to the dummy gate layer 1104 are exposed in the opening 1404 without consequence. This may increase the tolerance of the photolithographic process. The etching process may include any suitable etching technique such as wet etching, dry etching, RIE, ashing, and/or other etching methods. In an example, the etching process is a dry etching process using a fluorine-based etchant (e.g., $CF_4$, $CHF_3$, $CH_2F_2$, etc.). In some embodiments, etching includes multiple etching steps with different etching chemistries, each targeting a particular material of the dummy gate layer 1104, the I/O oxide layer 126, and the fill fin 108b. The trench 122 exposes a top surface of the fill fin 108b and the I/O oxide layer 126 on sidewalls of the fill fin 108b. After the etching process, the fill fin 108b has a lower height above the isolation features 106 than the fill fin 108a ($H_{d2}<H_{d1}$), such as about 15 nm to about 40 nm lower. In some embodiments, the top surface of the fill fin 108b in the trench 122 is above the top surface of the device fins 104 ($H_{d2}>H_f$). In the illustrated embodiment, the top surface of the fill fin 108b in the trench 122 is below the top surface of the device fins 104 ($H_{d2}<H_f$).

Figure 16:
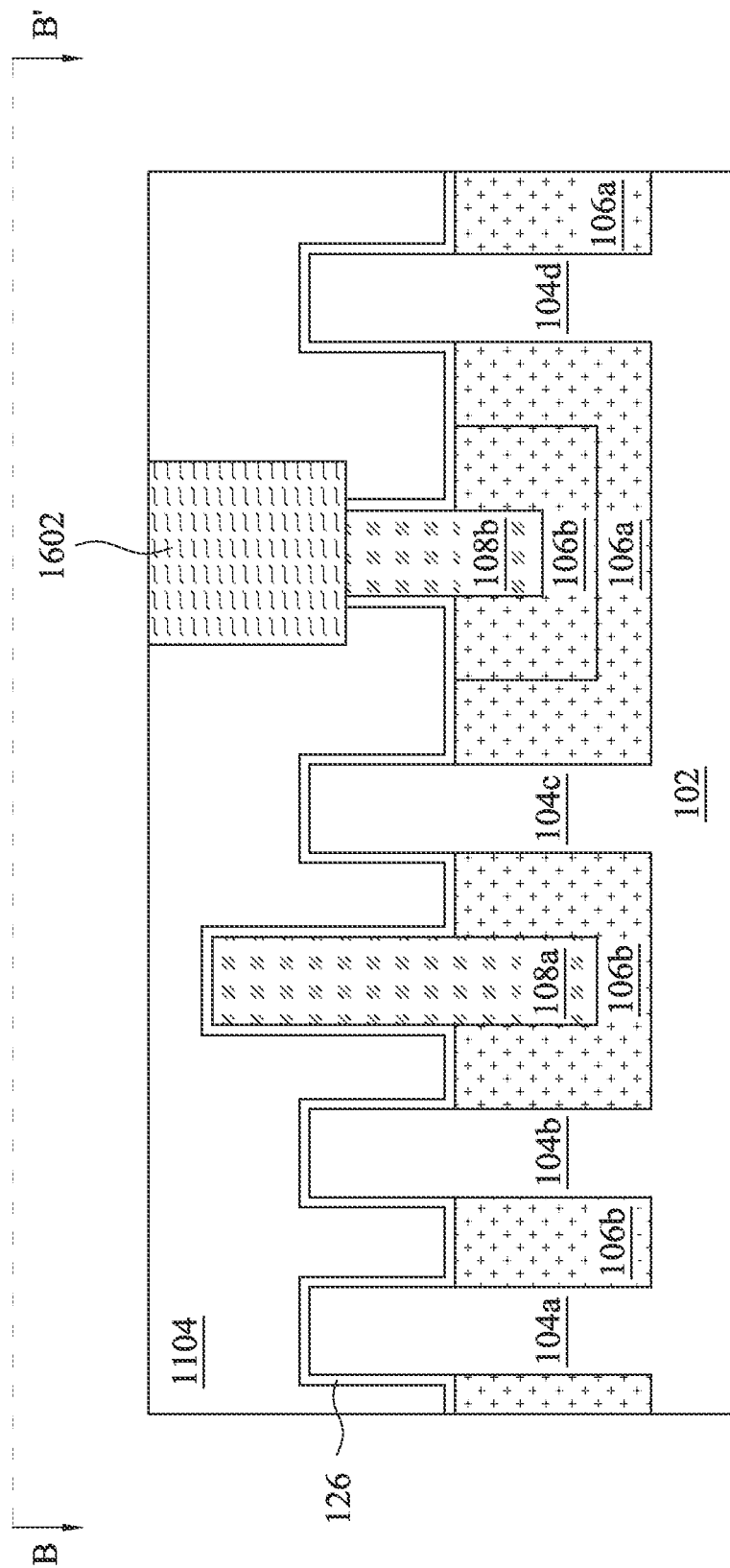

Referring to block 234 of FIG. 2B and to FIG. 16, the trench 122 is filled by a dielectric material 1602. The composition of the dielectric material 1602 is selected such that the dummy gate layer 1104 and the dielectric material 1602 have a high etch selectivity. In some embodiments, the etch selectivity between the dummy gate layer 1104 and the dielectric material 1602 has a ration larger than about 5:1, such as ranging from about 5:1 to about 20:1. The dielectric material 1602 caps the fill fin 108b in the trench 122 and prevent the fill fin 108b substantially from fin etch loss during the removal of the dummy gate layer 1104 in subsequent processes. Suitable materials for the dielectric material 1602 include silicon oxides, silicon nitrides, silicon carbides, silicon oxycarbide, polymer-like resin, and/or other suitable dielectric materials. The dielectric material 1602 may be deposited by any suitable technique including CVD, HDP-CVD, PVD, and/or spin-on techniques. In one such embodiment, a CVD process is used to deposit a flowable dielectric material that includes both a dielectric component and a solvent in a liquid or semiliquid state. A curing process is used to drive off the solvent, leaving behind the dielectric material 1602 in its solid state. Following the deposition, a CMP process may be performed to remove the excess dielectric material. The CMP process may also remove the patterned hard mask 1402.

Figure 17:
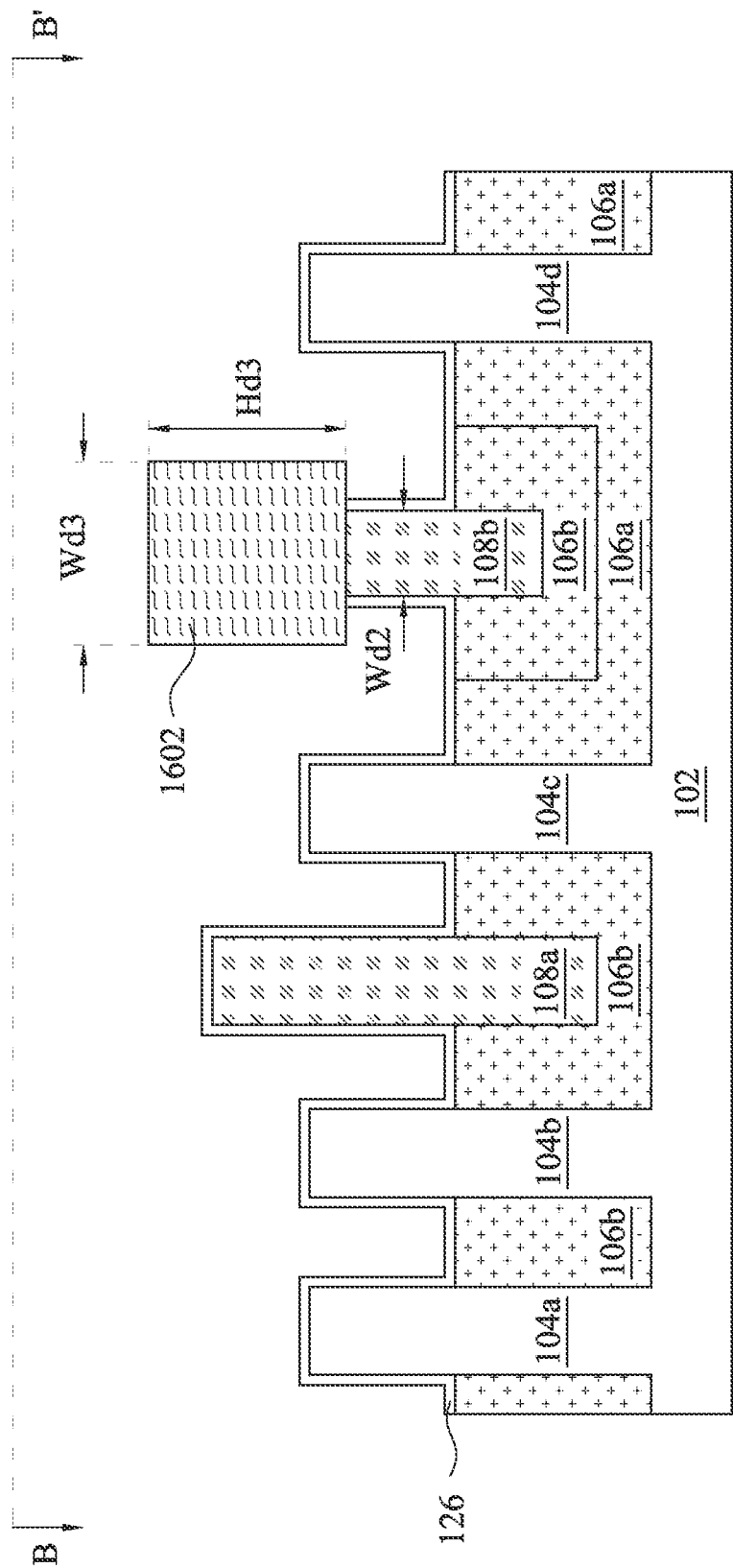

Referring to block 236 of FIG. 2B and to FIG. 17, the dummy gate layer 1104 is removed. The ILD layer 1302 surrounds the dummy gate 1204 allowing it to be removed, and a replacement gate to be formed in the resulting cavity. The removal of the dummy gate layer 1104 may be an etching process, including any suitable etching technique such as wet etching, dry etching, and/or other etching methods. The etchant is selected that it etches the dummy gate layer 1104, and the dielectric material 1602 above the fill fin 108b substantially remains unchanged. The dielectric material 1602 has a width $W_{d3}$ larger than the width $W_{d2}$ of the fill fin 108b. For example, the ratio $W_{d3}/W_{d2}$ is greater than 1.2, such as ranging from about 1.5 to about 3. The height $H_{d3}$ of the dielectric material 1602 is in a range from about 15 nm to about 40 nm in some embodiments. The fill fin 108b is capped under the dielectric material 1602 and therefore does not suffer fin loss during the dummy gate removal process.

Figure 18:
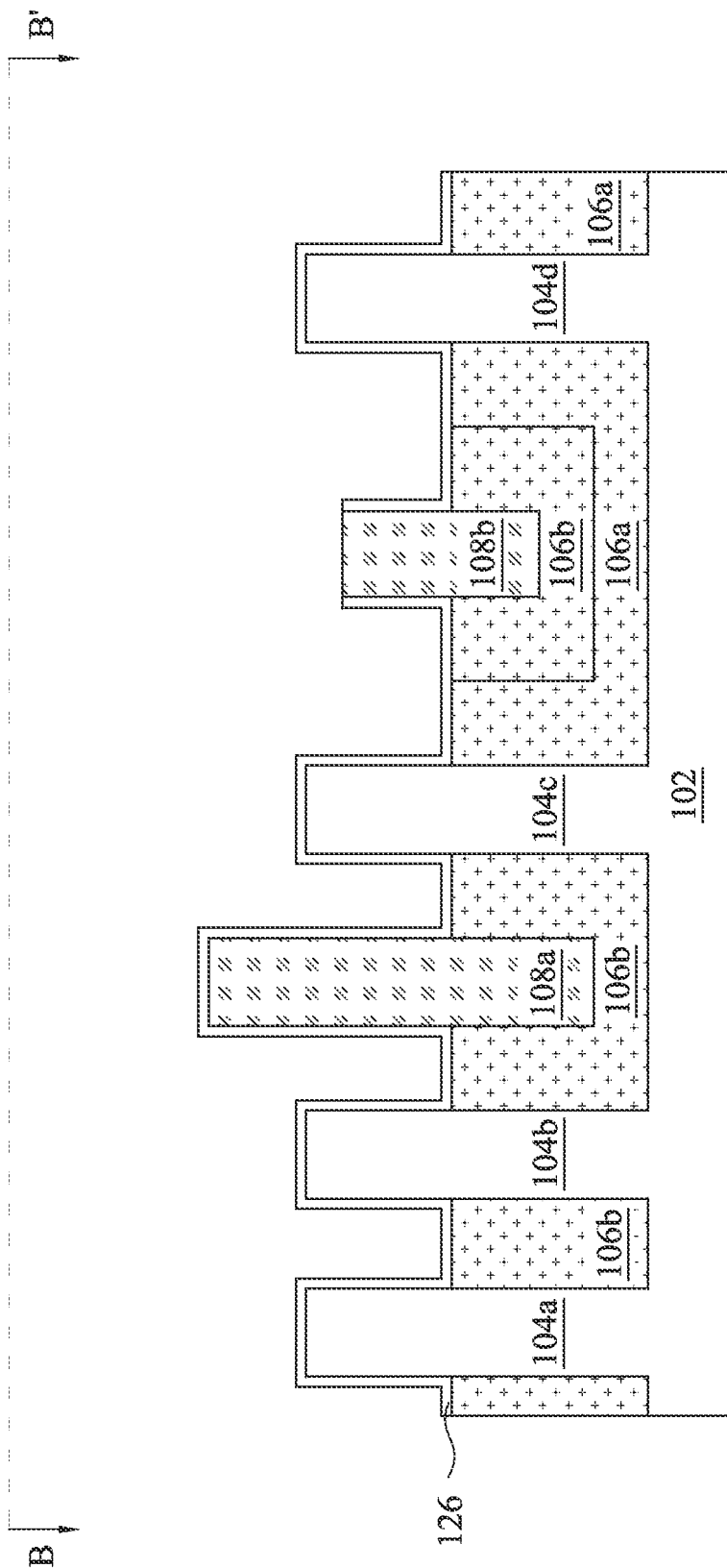

Referring to block 238 of FIG. 2B and to FIG. 18, the dielectric material 1602 is removed in an etching process. The etching process may include any suitable etching technique such as wet etching, dry etching, RIE, ashing, and/or other etching methods. The etchant is selected that it etches the dielectric material 1602 and the fill fin 108b and the I/O oxide layer 126 substantially remain unchanged.

Subsequently, a gate stack 114 is formed on the workpiece 100 wrapping around the channel regions 110 of the device fins 104. Although it is understood that the gate stack 114 may be any suitable gate structure, in some embodiments, the gate stack 114 is a high-k metal gate that includes a gate dielectric layer 116 and a gate electrode 118 that may each comprise a number of sub-layers. The gate stack 114 may further include an interfacial layer beneath the gate dielectric layer 116.

Figure 19:
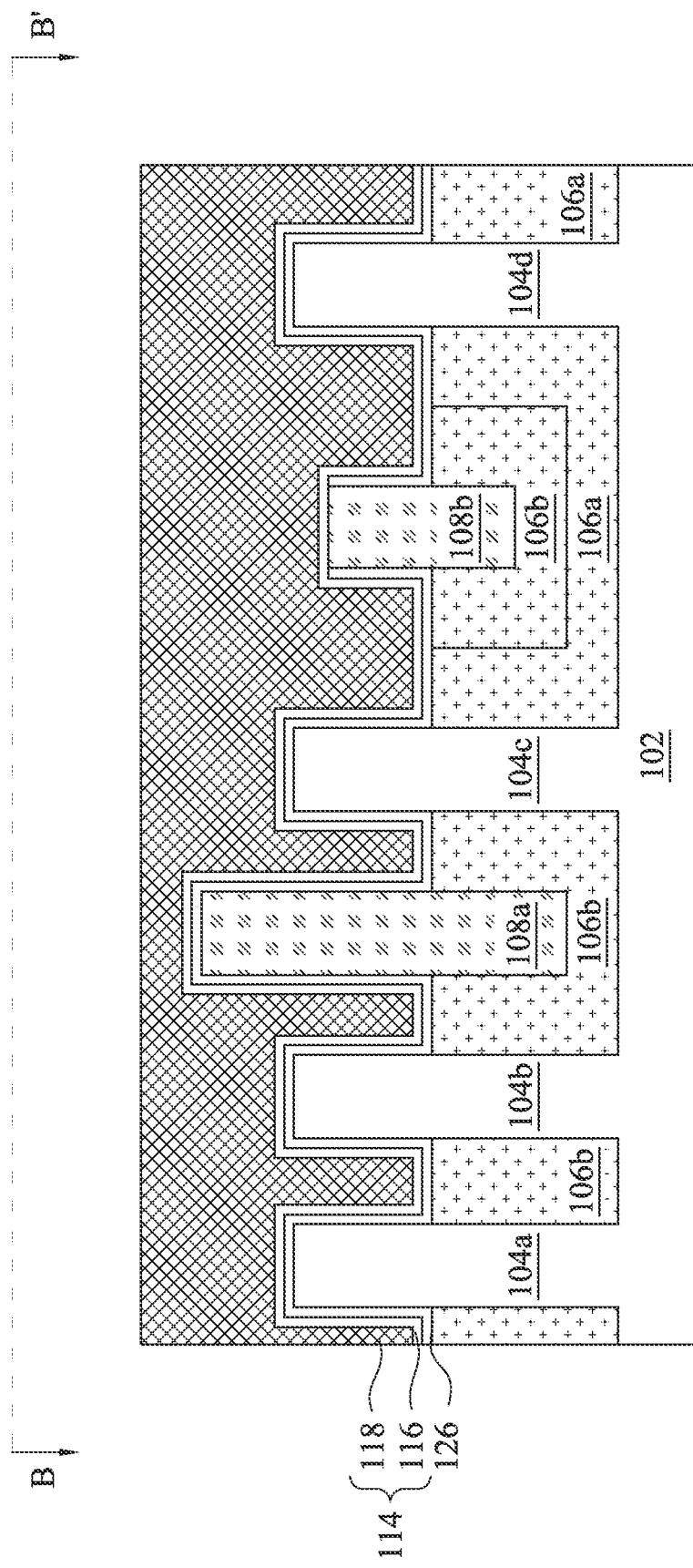

Referring to block 240 of FIG. 2B and to FIG. 19, in some such embodiments, the gate dielectric layer 116 is deposited on the workpiece 300 by any suitable technique, such as ALD, CVD, metal-organic CVD (MOCVD), PVD, thermal oxidation, combinations thereof, and/or other suitable techniques. A high-k-type gate dielectric layer 116 may include a metal oxide (e.g., LaO, AlO, ZrO, TiO, $Ta_2O_5$, $Y_2O_3$, $SrTiO_3$ (STO), $BaTiO_3$ (BTO), BaZrO, HfZrO, HfLaO, HfTaO, HfTiO, $(Ba,Sr)TiO_3$ (BST), $Al_2O_3$, etc.) a metal silicate (e.g., HfSiO, LaSiO, AlSiO, etc.), a metal or semiconductor nitride, a metal or semiconductor oxynitride, combinations thereof, and/or other suitable materials. Likewise, a gate electrode 118 is deposited on the channel regions 110 of the workpiece 300. In particular, the gate electrode 118 may be deposited on the gate dielectric layer 116. In various examples, the gate electrode 118 may include a single layer or multiple layers, such as a metal layer, a liner layer, a wetting layer, and/or an adhesion layer. The gate electrode layer 118 may further include a work function metal layer and a metal fill layer. The work function metal layer may include a p-type work function metal layer or an n-type work function metal layer. The p-type work function metal layer comprises a metal selected from, but not limited to, the group of titanium nitride (TiN), tantalum nitride (TaN), ruthenium (Ru), molybdenum (Mo), tungsten (W), platinum (Pt), or combinations thereof. The n-type work function metal layer comprises a metal selected from, but not limited to, the group of titanium (Ti), aluminum (Al), tantalum carbide (TaC), tantalum carbonitride (TaCN), tantalum silicon nitride (TaSiN), or combinations thereof. The p-type or n-type work function metal layer may further include a plurality of layers and may be deposited by CVD, PVD, and/or other suitable process. The metal fill layer may include aluminum (Al), tungsten (W), or copper (Cu) and/or other suitable materials. The metal fill layer may be formed by CVD, PVD, plating, and/or other suitable processes.

Figure 20A:
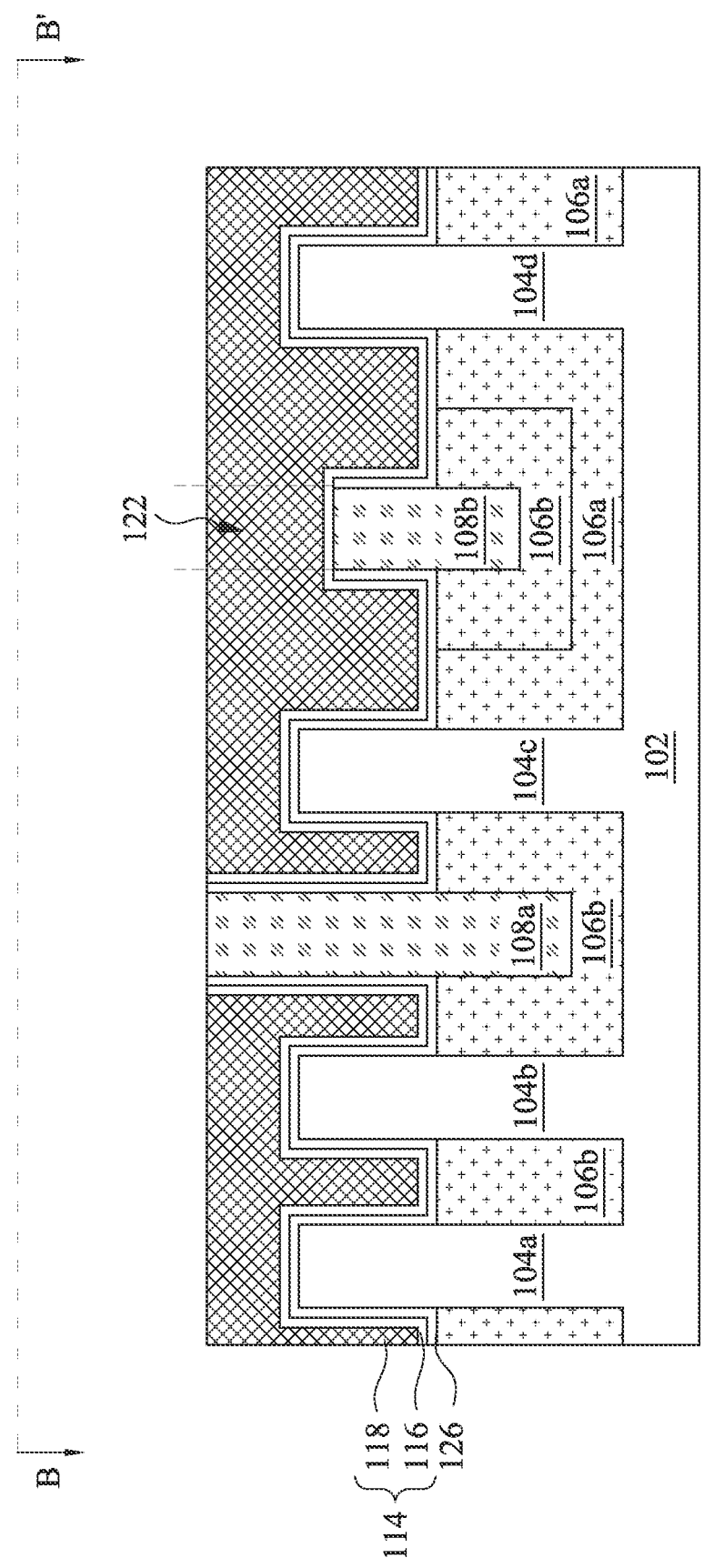
Figure 20B:
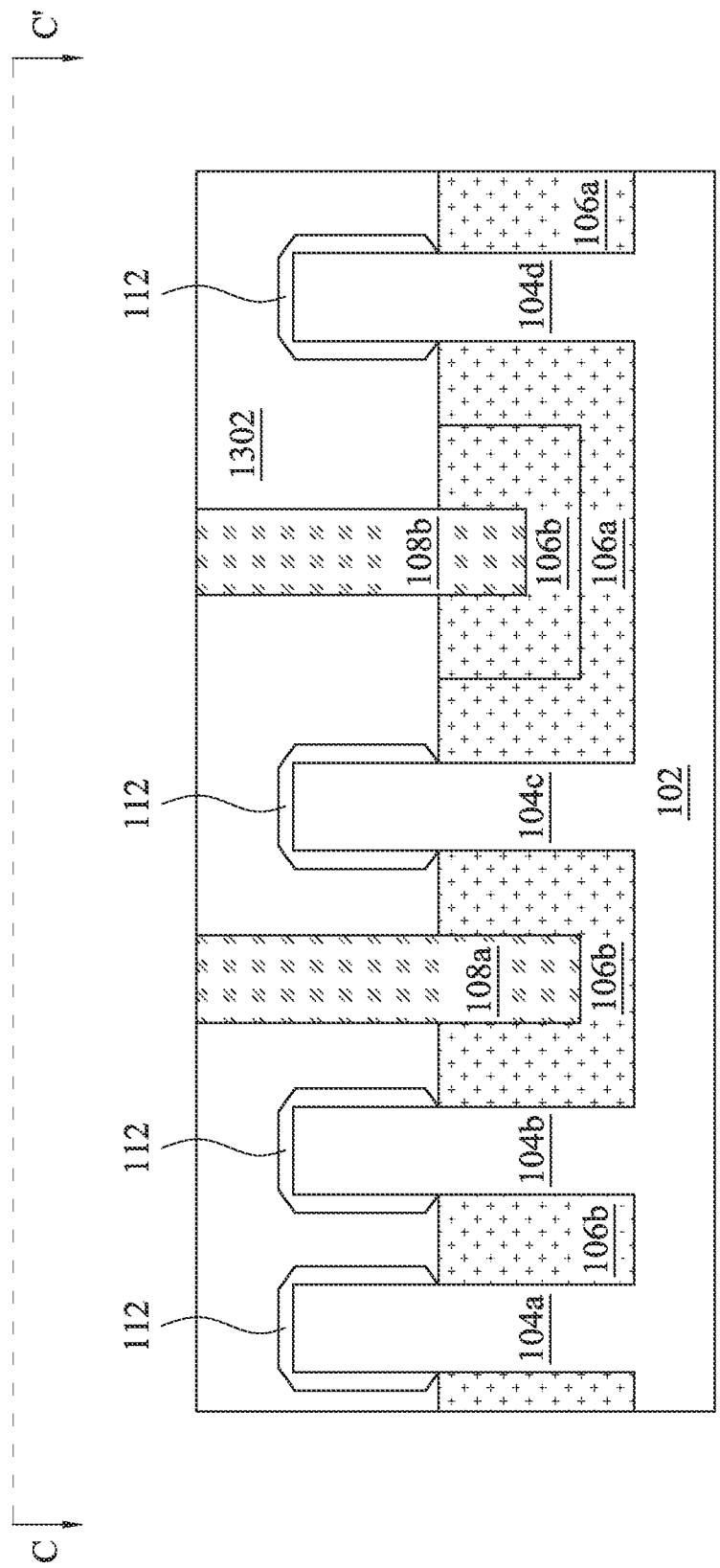

Referring to block 242 of FIG. 2B and to FIGS. 20A and 20B, a CMP process is performed to produce a substantially planar top surface of the gate stack 114 and also expose the top surfaces of fill fins 108a and 108b. Fill fins 108a and 108b divide the gate stack 114 into several segments and provide isolation between the segmented gate stacks on FinFETs formed on different sides of a fill fin. The opening 122 on the fill fin 108b provides a gate stack interconnection for FinFETs that need to have the segmented gate stacks electrically coupled. The gate dielectric layer 116 and the gate electrode 118 of the gate stack 140 extend continuously from one FinFET on one side of the fill fin 108b to another FinFET on another side of the fill fin 108b.

Figure 21:
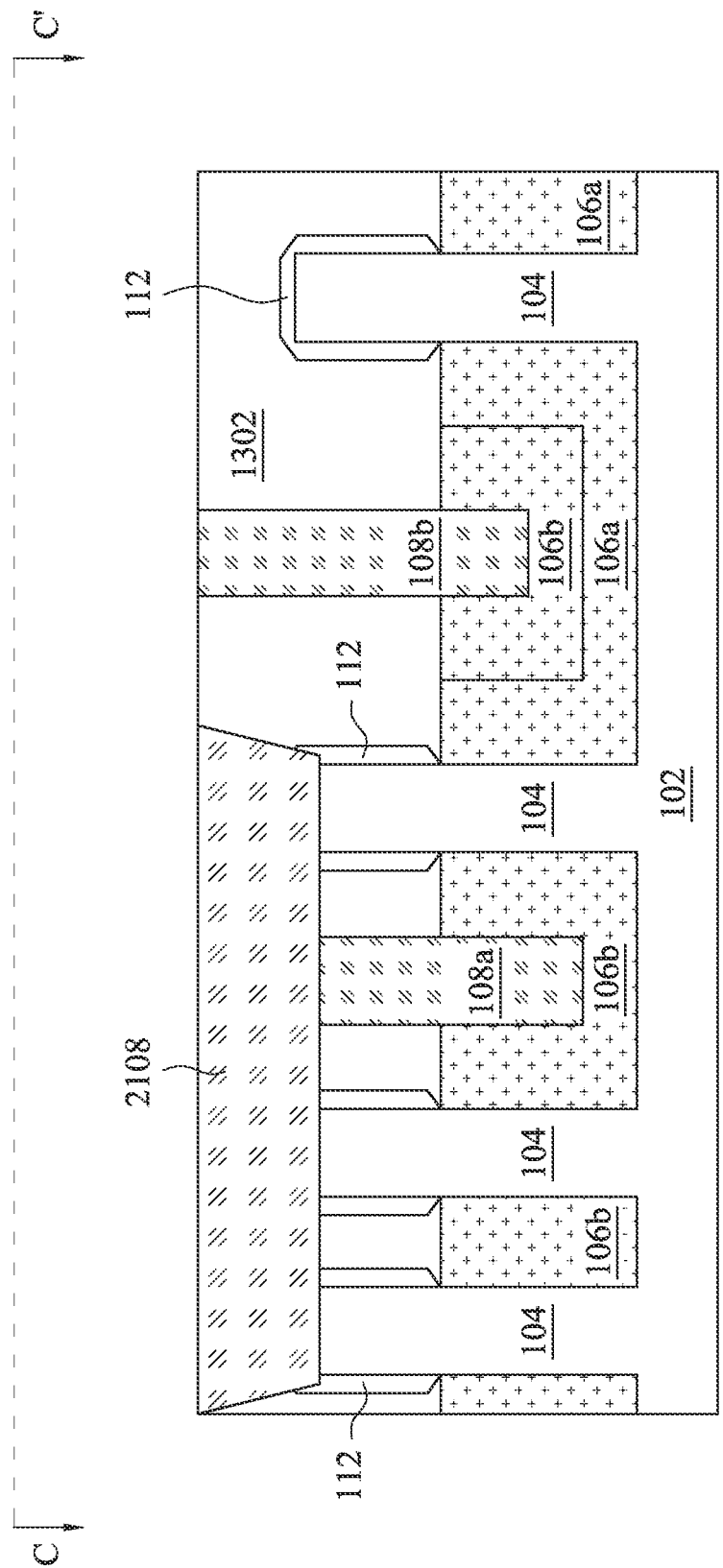

Although not shown in FIG. 2B, the method 200 may proceed to further processes in order to complete the fabrication of the workpiece 300. For example, as illustrated in FIG. 21, the method 200 may form a source/drain contact 2108 above the source/drain features 112. The source/drain contact 2108 may be formed by first etching the ILD layer 1302 in the source/drain regions to form a recess. The etching may also remove top portions of the source/drain features 112 and the fill fin 108a. Subsequently, a conductive material is deposited in the recess to form the source/drain contact 2108. In an embodiment, the conductive material is a metal such as aluminum, tungsten, copper, cobalt, combinations thereof, or other suitable material. The conductive material can be deposited using suitable process, such as CVD, PVD, plating, and or other suitable processes. The source/drain contact 2108 may extend above multiple source/drain features 112, providing interconnections between several source/drain regions. The fill fin 108a provides structural support to the conductive material in the interconnections, avoiding conductive material to pull into ILD layer 1302 or into isolation features. The source/drain contact 2108 shown in the FIG. 21 is merely an example. The method 200 may further form other source/drain contacts and multi-layer interconnect structure that connects the gate stack 114 and the source/drain contacts with other parts of the workpiece 300 to form a complete IC.

Figure 22A:
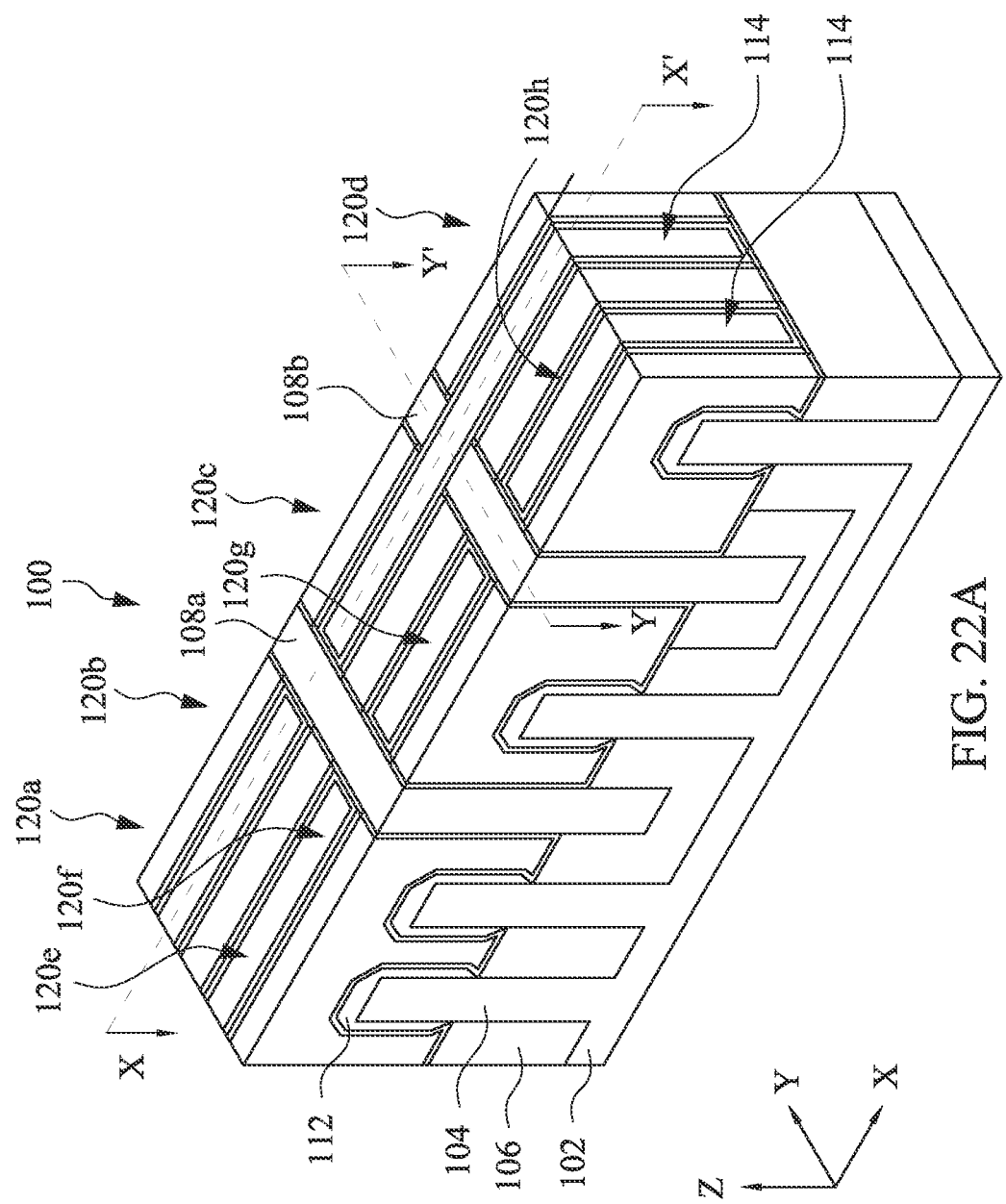
FIG. 22A is a perspective view of another workpiece according to various aspects of the present disclosure.
Figure 22B:
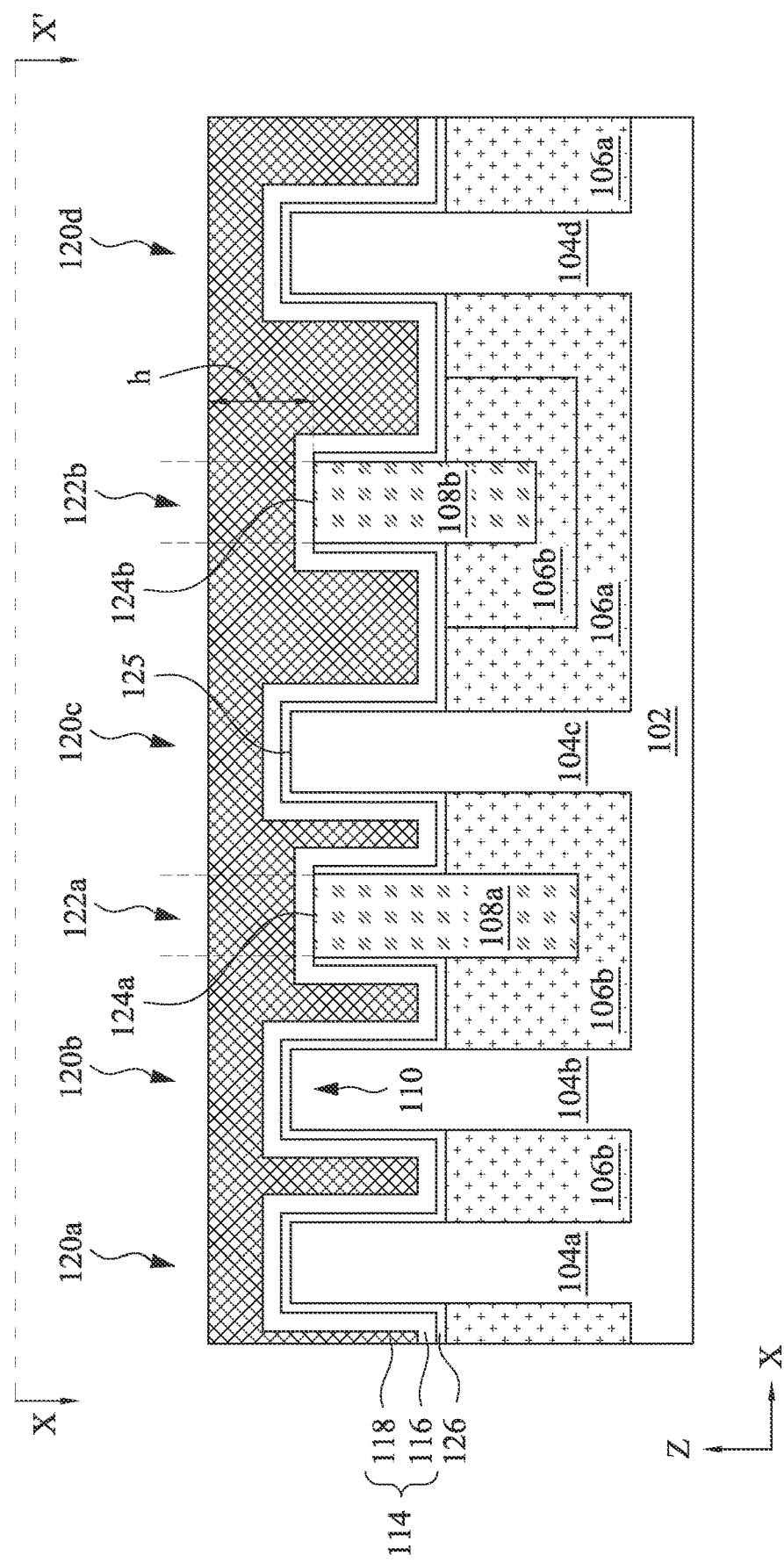
FIG. 22B is a cross-sectional view taken along the channel region of the workpiece in FIG. 22A at various stages of the method of fabricating the workpiece with the fill fins according to various aspects of the present disclosure.

The illustrated workpiece 300 in FIGS. 3-21 is merely an example of some embodiments of the method 200. The method 200 may have various other embodiments. For example, similar to the fill fin 108b, the fill fin 108a may also form an opening to provide gate stack interconnection for FinFETs on both sides of the fill fin 108a. Referring to FIGS. 22A and 22B, wherein FIG. 22A is a perspective view and FIG. 22B is a sectional view along the dashed line X-X', the fill fin 108a has an opening 122a and the fill fin 108b has an opening 122b in the channel region. The two openings 122a and 122b provide gate stack interconnections among FinFETs 120a-d continuously. In the illustrated embodiment in FIG. 22A, since there are no openings for the fill fins 108a and 108b in channel regions of the FinFETs 120e-h, the gate stack 114 of FinFET 120e-h remains segmented. Yet in another embodiment, the fill fin 108b may have extra openings in the channel region between FinFETs 120g and 120h, providing gate stack interconnection between FinFETs 120g and 120h, as well as between FinFETs 120c and 120d. Various openings may be formed individually or collectively on one or more fill fins to provide gate stack interconnections for multiple pairs or groups of FinFETs.

Although not intended to be limiting, one or more embodiments of the present disclosure provide many benefits to a semiconductor device and the formation thereof, including FinFETs. For example, the fill fins may be formed between device fins to increase fin density, which produces relatively close spacing between fins to better accommodate features to be form above the fins. Further, the fill fins provide isolation and interconnection between FinFETs formed on device fins depends on needs, for which the above disclosure is well suited. The work function metal of a gate stack is substantially free of damages usually found in conventional metal gate cut processes, such as the ones due to an over etch to the fin bottom. Further, the disclosed methods can be easily integrated into existing semiconductor manufacturing processes.

Thus, the present disclosure provides examples of fill fins for integrated circuit fabrication. In some examples, a semiconductor device includes a semiconductor substrate, first and second device fins extending from the semiconductor substrate, and a fill fin disposed on the semiconductor substrate and between the first and second device fins, wherein the fill fin has an opening. The semiconductor device further includes a first gate structure extending continuously from a channel region of the first device fin to a channel region of the second device fin through the opening. In an embodiment, the semiconductor device further includes a dielectric material layer disposed between the first and second device fins and between the fill fin and the semiconductor substrate. In an embodiment, the dielectric material layer is a shallow trench isolation (STI) feature. In an embodiment, the semiconductor device includes a second gate structure over the first device fin and a third gate structure over the second device fin, wherein the second gate structure is electrically isolated from the third gate structure by the fill fin. In an embodiment, a top surface of the fill fin outside the opening is above top surfaces of the first and second device fins and a bottom surface of the fill fin is above bottom surfaces of the first and second device fins. In an embodiment, the top surface of the fill fin in the opening is below the top surfaces of the first and second device fins. In an embodiment, the fill fin includes metal oxide. In an embodiment, the first gate structure fills up the opening. In an embodiment, the opening is disposed in a topmost portion of the fill fin. In an embodiment, the opening has a vertical depth in a range from about 15 nm to about 40 nm.

In further examples, a device includes a device fin extending from a substrate, a dielectric fin disposed above the substrate, a top portion of the dielectric fin having a notch, and an isolation feature disposed between the device fin and the dielectric fin and between the dielectric fin and the substrate. The device further includes a gate structure engaging a top portion of the device fin and extending above the notch. In an embodiment, a bottom surface of the dielectric fin is between a top surface and a bottom surface of the isolation feature. In an embodiment, a bottom surface of the dielectric fin is higher than a bottom surface of the device fin. In an embodiment, a top surface of the dielectric fin outside the notch is higher than a top surface of the device fin and the top surface of the dielectric fin inside the notch is lower than the top surface of the device fin. In an embodiment, the gate structure includes an input/output (I/O) oxide layer on a sidewall of the dielectric fin and is free of the I/O oxide layer on a top surface of the dielectric fin inside the notch. In an embodiment, the device fin and the dielectric fin have substantially the same horizontal width.

In yet further examples, a method includes receiving a substrate; forming on the substrate a device fin, an isolation feature surrounding the device fin, and a fill fin above the isolation feature; recessing a portion of the fill fin to form a trench, the trench being above the isolation feature; and forming a gate stack over a channel region of the device fin, wherein a portion of the gate stack fills the trench. In an embodiment, the method further includes forming a sacrificial gate covering the device fin and the fill fin; removing a portion of the sacrificial gate covering the fill fin; depositing a dielectric capping material in the trench; removing the sacrificial gate, while the dielectric capping material substantially remains; and removing the dielectric capping material, thereby exposing the fill fin. In an embodiment, the isolation feature is a shallow trench isolation (STI) feature. In an embodiment, a top surface of the fill fin is above a top surface of the device fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
   a first transistor, comprising:
      a first channel region;
      a first gate metal engaging the first channel region; and
      a first portion of a dielectric material layer disposed under the first gate metal and on a sidewall of the first gate metal;
   a second transistor, comprising:
      a second channel region;
      a second gate metal engaging the second channel region, wherein a longitudinal axis of the first gate metal is aligned with a longitudinal axis of the second gate metal; and
      a second portion of the dielectric material layer disposed under the second gate metal and on a sidewall of the second gate metal,
      wherein the sidewall of the first gate metal faces the sidewall of the second gate metal, and the first portion of the dielectric material layer and the second portion of the dielectric material layer are disposed between the sidewall of the first gate metal and the sidewall of the second gate metal; and
   a dielectric block disposed between the sidewall of the first gate metal and the sidewall of the second gate metal,
   wherein a third portion of the dielectric material layer connects the first portion of the dielectric material layer and the second portion of the dielectric material layer, and the third portion of the dielectric material layer is above and in contact with the dielectric block.

2. The IC structure of claim 1, wherein the dielectric block has a first sidewall surface facing the sidewall of the first gate metal, a second sidewall surface facing the sidewall of the second gate metal, and a horizontal surface extending from the first sidewall surface to the second sidewall surface, and wherein the third portion of the dielectric material layer is in physical contact with the horizontal surface of the dielectric block.

3. The IC structure of claim 2, wherein the horizontal surface is a top surface of the dielectric block.

4. The IC structure of claim 2, wherein the horizontal surface is in an opening of a top portion of the dielectric block.

5. The IC structure of claim 4, wherein the horizontal surface is below a top surface of the first channel region and a top surface of the second channel region.

6. The IC structure of claim 1, wherein the first dielectric material layer and the second dielectric material layer include a same material composition.

7. The IC structure of claim 1, wherein the first portion of the dielectric material layer includes a first oxide layer and a first high-k dielectric layer, and the second portion of the dielectric material layer includes a second oxide layer and a second high-k dielectric layer, and wherein the third portion of the dielectric material layer connects the first high-k dielectric layer and the second high-k dielectric layer.

8. The IC structure of claim 7, wherein the first oxide layer and the second oxide layer are separated by the dielectric block.

9. The IC structure of claim 1, wherein each of the first channel region and the second channel region has a fin-shape structure.

10. The IC structure of claim 1, further comprising: a metal feature connecting the first gate metal and the second gate metal.

11. An integrated circuit (IC) structure, comprising:
a fin including a first semiconductor material;
a substrate below the fin, the substrate including a second semiconductor material;
an isolation feature over the substrate, the fin protruding from the isolation feature;
a metal gate disposed on sidewalls and a top surface of the fin, the metal gate including a first sidewall and a second sidewall opposing the first sidewall;
a first dielectric wall disposed on the first sidewall of the metal gate, a bottom portion of the first dielectric wall below a top surface of the isolation feature; and
a second dielectric wall disposed on the second sidewall of the metal gate, a bottom portion of the second dielectric wall below the top surface of the isolation feature, the first and second dielectric walls sandwiching the metal gate.

12. The IC structure of claim 11, wherein the bottom portion of the first dielectric wall is embedded in the isolation feature, and the bottom portion of the second dielectric wall is embedded in the isolation feature.

13. The IC structure of claim 11, wherein the first semiconductor material is different from the second semiconductor material.

14. The IC structure of claim 11, wherein top surfaces of the metal gate and the first and second dielectric walls are substantially coplanar.

15. The IC structure of claim 11, wherein a top portion of the second dielectric wall has a recess, wherein the metal gate extends directly above the recess.

16. The IC structure of claim 11, wherein a bottom surface of the first dielectric wall is below a bottom surface of the second dielectric wall.

17. The IC structure of claim 11, wherein the fin is a first fin and the metal gate is a first metal gate, the IC structure further comprising:
a second fin, the first and second fin sandwiching the first dielectric wall; and
a second metal gate disposed on sidewalls and a top surface of the second fin, the first dielectric wall isolating the first metal gate from the second metal gate.

18. An integrated circuit (IC) structure, comprising:
a first fin extending lengthwise along a first direction;
a second fin extending lengthwise along the first direction;
a first gate structure engaging the first fin, the first gate structure extending lengthwise along a second direction perpendicular to the first direction;
a second gate structure engaging the second fin, the second gate structure extending lengthwise along the second direction;
a dielectric block disposed between the first and second fins and extending lengthwise along the first direction, wherein the dielectric block isolates the first gate structure from the second gate structure;
a third gate structure engaging the first fin, the third gate structure extending lengthwise along the second direction; and
a fourth gate structure engaging the second fin, the fourth gate structure extending lengthwise along the second direction,
wherein the third gate structure abuts the fourth gate structure at a location directly above the dielectric block.

19. The IC structure of claim 18, further comprising:
a substrate; and
an isolation feature over the substrate, wherein the first and second fins are protruding through the isolation feature, and a bottommost portion of the dielectric block is above the isolation feature.

20. The IC structure of claim 18, wherein the dielectric block has an uneven top surface.

* * * * *